United States Patent
Lee

(10) Patent No.: US 10,985,174 B2
(45) Date of Patent: Apr. 20, 2021

(54) SEMICONDUCTOR DEVICE

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/155,405

(22) Filed: Oct. 9, 2018

(65) Prior Publication Data

US 2019/0043888 A1   Feb. 7, 2019

Related U.S. Application Data

(62) Division of application No. 15/358,269, filed on Nov. 22, 2016, now Pat. No. 10,128,264.

(30) Foreign Application Priority Data

Jan. 21, 2016   (KR) .................. 10-2016-0007602
Jun. 15, 2016   (KR) .................. 10-2016-0074629

(51) Int. Cl.
| | | |
|---|---|---|
| H01L 27/11582 | (2017.01) | |
| H01L 29/78 | (2006.01) | |
| H01L 27/11565 | (2017.01) | |
| H01L 27/1157 | (2017.01) | |
| H01L 27/11575 | (2017.01) | |

(52) U.S. Cl.
CPC .... *H01L 27/11582* (2013.01); *H01L 27/1157* (2013.01); *H01L 27/11565* (2013.01); *H01L 27/11575* (2013.01); *H01L 29/7827* (2013.01)

(58) Field of Classification Search
None
See application file for complete search history.

(56) References Cited

U.S. PATENT DOCUMENTS

| | | | | |
|---|---|---|---|---|
| 4,663,831 A | * | 5/1987 | Birrittella | ......... H01L 21/28531 148/DIG. 11 |
| 5,981,377 A | * | 11/1999 | Koyama | ........... H01L 21/76807 257/E21.579 |
| 2014/0097484 A1 | * | 4/2014 | Seol | .................. H01L 29/42332 257/324 |

FOREIGN PATENT DOCUMENTS

| | | |
|---|---|---|
| CN | 101241914 A | 8/2008 |
| CN | 103715176 A | 4/2014 |
| CN | 104078467 A | 10/2014 |
| CN | 104956485 A | 9/2015 |
| JP | 2004-363599 A | 12/2004 |

OTHER PUBLICATIONS

Office Action issued by China National Intellectual Property Administration dated Jan. 13, 2020.
Notice of Allowance issued by the China National Intellectual Property Administration dated Nov. 24, 2020.

* cited by examiner

*Primary Examiner* — Anthony Ho
*Assistant Examiner* — Kevin Quinto
(74) *Attorney, Agent, or Firm* — IP & T Group LLP

(57) ABSTRACT

The semiconductor device according to the embodiments of the present disclosure may include a contact line connecting a pair of channel pillars with a slit disposed therebetween. The contact line may extend in various directions, for example, a diagonal direction with respect to the slit. The contact line may contacts an upper surface or a side wall of the channel pillars.

7 Claims, 20 Drawing Sheets

SEMICONDUCTOR DEVICE

CROSS-REFERENCE TO RELATED APPLICATION

This application is a division of U.S. patent application Ser. No. 15/358,269 filed on Nov. 22, 2016, which claims priority under 35 U.S.C. § 119(a) to Korean patent application numbers 10-2016-0007602 filed on Jan. 21, 2016 and 10-2016-0074629 filed on Jun. 15, 2016. The disclosure of each of the foregoing applications is incorporated herein by reference in their entirety.

BACKGROUND

Field of Invention

Embodiments of the present disclosure relate to a semiconductor device and a manufacturing method for the same, and more particularly, to a semiconductor device that includes a 3-dimensional memory device and a manufacturing method for the same.

Description of Related Art

A 2-dimensional semiconductor device may include memory cells arranged in 2-dimensions. But the 2-dimensional semiconductor devices have limitations in the degree of integration. To overcome such limitations and increase the degree of integration of the memory cells, a 3-dimensional semiconductor device that includes memory cells arranged in 3-dimensions was proposed.

The 3-dimensional semiconductor device includes a cell string having a 3-dimensional structure. The cell string has a 3-dimensional structure and includes memory cells and a channel layer. The memory cells are stacked on a substrate and spaced apart from each other. The channel layer extends along the direction the memory cells are stacked and connects the memory cells in series. One end of the channel layer may be connected to a bit line. The channel layer may be arranged in zig-zag form so that it may be densely packed. For a proper alignment of the bit line and the channel layer, the bit line may be formed in a narrow pitch.

The bit line may be formed by a photolithography process. A distance between the bit lines is limited depending on a limited resolution of a light source. The narrower the distance between the bit lines, the more likely a process defect such as a bridge occurs.

SUMMARY

According to an embodiment of the present disclosure, there is provided a semiconductor device including a first upper stacked body and a second upper stacked body which neighbor each other in a first direction and are separated from each other by a slit, wherein the slit extends along a second direction; a first pillar group including first to $N^{th}$ channel pillars, wherein the first to $N^{th}$ channel pillars of the first pillar group penetrate the first upper stacked body; a second pillar group including first to $N^{th}$ channel pillars, wherein the first to $N^{th}$ channel pillars of the second pillar group penetrate the second upper stacked body; and a contact line extending in a diagonal direction with respect to the first direction and the second direction, and connecting the $N^{th}$ channel pillar of the first pillar group and the $N^{th}$ channel pillar of the second pillar group adjacent to the slit, wherein N is a positive integer.

According to another embodiment of the present disclosure, there is provided a semiconductor device including a first upper stacked body and a second upper stacked body neighboring each other in a first direction, and separated from each other by a slit, wherein the slit extends along a second direction; a first pillar group including first to $N^{th}$ channel pillars, wherein the first to $N^{th}$ channel pillars of the first pillar group penetrate the first upper stacked body; a second pillar group including first to $N^{th}$ channel pillars, wherein the first to $N^{th}$ channel pillars of the second pillar group penetrate the second upper stacked body; and a contact line extending from the $N^{th}$ channel pillar of the first pillar group adjacent to the slit towards the $N^{th}$ channel pillar of the second pillar group adjacent to the slit, wherein the contact line extends towards inside of the first upper stacked body and the second upper stacked body, and directly contacts a side wall of the $N^{th}$ channel pillar of the first pillar group and a side wall of the $N^{th}$ channel pillar of the second pillar group, wherein N is a positive integer.

According to anther embodiment of the present disclosure, there is provided a method for manufacturing a semiconductor device, the method including forming a first upper stacked body surrounding a first pillar group including first to $N^{th}$ channel pillars, and a second upper stacked body surrounding a second pillar group including first to $N^{th}$ channel pillars, wherein the first upper staked body and the second upper stacked body neighbor each other in a first direction; forming an insulating layer covering the first and second upper stacked bodies; forming a line groove exposing a side wall of the $N^{th}$ channel pillar of the first pillar group and a side wall of the $N^{th}$ channel pillar of the second pillar group by etching the insulating layer, wherein a portion of the first and second upper stacked bodies between the $N^{th}$ channel pillar of the first pillar group and the $N^{th}$ channel pillar of the second pillar group neighboring each other is etched; and forming a contact line inside the line groove, wherein the contact line extends from the $N^{th}$ channel pillar of the first pillar group towards the $N^{th}$ channel pillar of the second pillar group, and directly contacts a side wall of the $N^{th}$ channel pillar of the first pillar group and a side wall of the $N^{th}$ channel pillar of the second pillar group.

BRIEF DESCRIPTION OF THE DRAWINGS

Example embodiments will now be described more fully hereinafter with reference to the accompanying drawings; however, the drawings may illustrate different forms and should not be construed as limited to the embodiments set forth therein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present between two elements. Like reference numerals refer to like elements throughout.

DETAILED DESCRIPTION

Figure 1A:
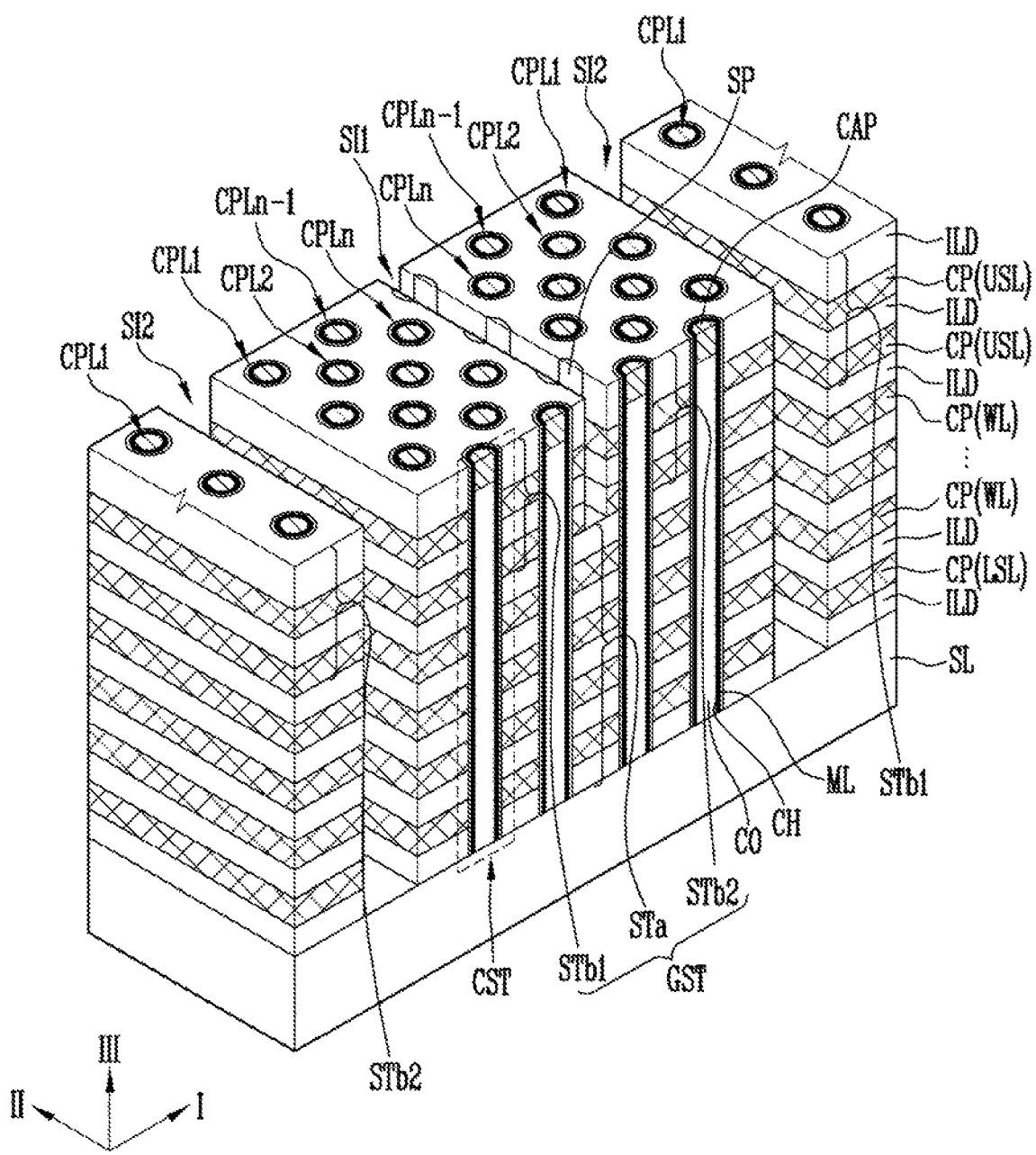
FIG. 1A and FIG. 1B are perspective views illustrating a cell string structure of a semiconductor device according to an embodiment of the present disclosure.

Hereinafter, embodiments will be described in greater detail with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also noted that in this specification, "connected/coupled" refers to one component not only directly coupling another component but also indirectly coupling another component through an intermediate component. Furthermore, "directly connected/directly coupled" refers to one component directly coupling another component without an intermediate component.

Embodiments of the present disclosure may provide a semiconductor device capable of reducing a process defect and a manufacturing method for the same.

Figure 1B:
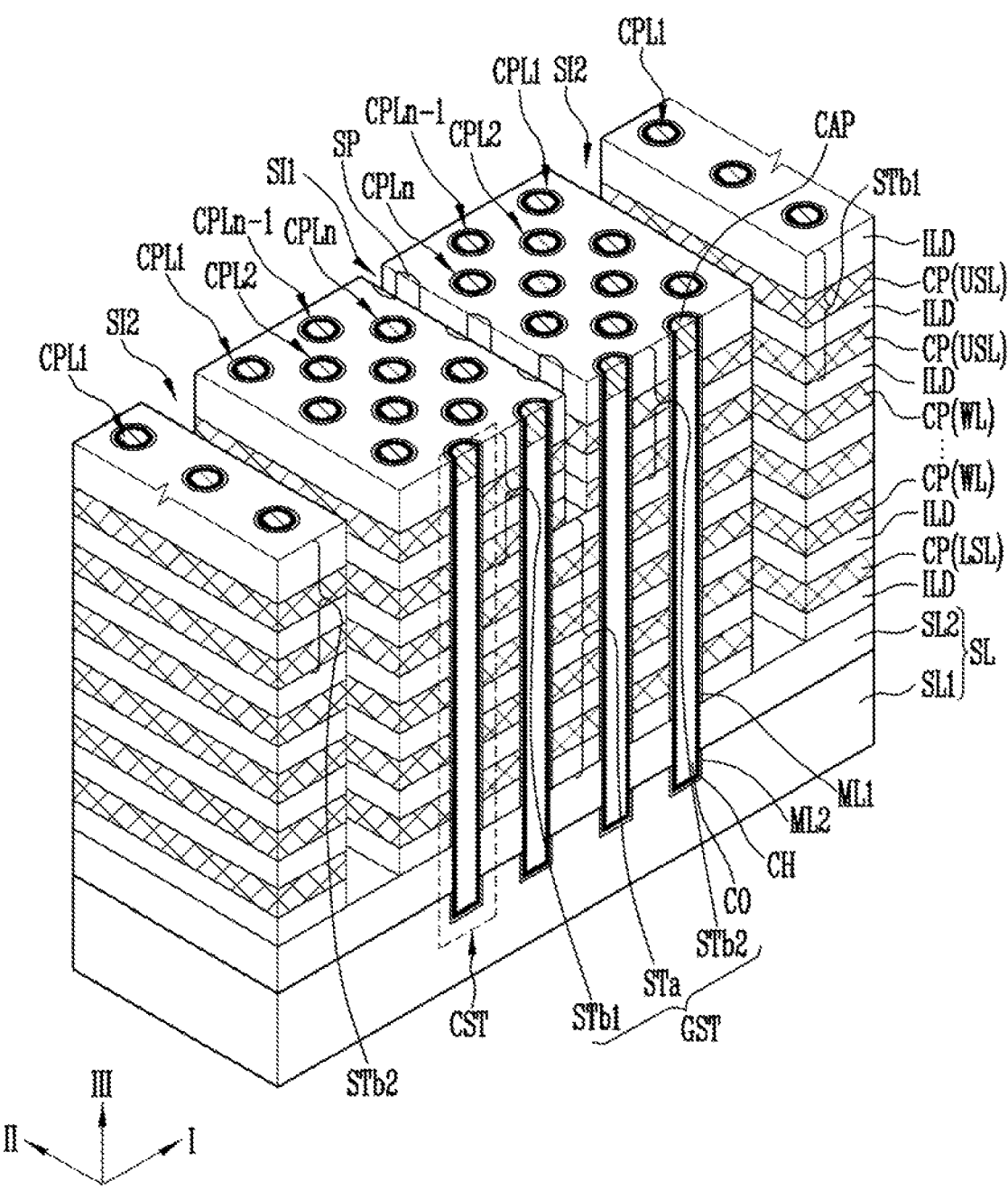

FIG. 1A and FIG. 1B are perspective views illustrating a cell string structure of a semiconductor device according to an embodiment of the present disclosure. Structures arranged on top of a first upper stacked body and a second upper stacked body, and insulating material for filling a first slit and a second slit are not illustrated in FIG. 1A and FIG. 1B.

Referring to FIG. 1A and FIG. 1B, a semiconductor device according to an embodiment of the present disclosure may include interlayer insulating layers ILD and conductive patterns CP which are stacked alternately on a source line SL. Each of the interlayer insulating layers ILD and the conductive patterns CP may extend in a first direction I and in a second direction II. The second direction II is perpendicular to the first direction I.

The interlayer insulating layers ILD and the conductive patterns CP may be patterned into a gate stacked body GST by forming the first slit SI1 and the second slit SI2. The gate stacked body GST may include a lower stacked body STa, a first upper stacked body STb1, and a second upper stacked body STb2.

The first upper stacked body STb1 and the second upper stacked body STb2 neighbor each other in the first direction I. The first upper stacked body STb1 and the second upper stacked body STb2 may be divided by the first and second slits SI1 and SI2. Each of the first and second slits SI1 and SI2 extends along the second direction II. The interlayer insulating layers ILD and the conductive patterns CP may be divided into the first upper stacked bodies STb1 and the second upper stacked bodies STb2 by the first and second slits SI1 and SI2. The first upper stacked bodies STb1 and the second upper stacked bodies STb2 are arranged alternately along the first direction I.

The lower stacked body STa may be arranged below the first upper stacked body STb1 and the second upper stacked body STb2. The lower stacked body STa may be divided into multiple pieces by the second slits SI2. One pair of the first upper stacked body STb1 and the second upper stacked body STb2 may overlap the lower stacked body STa.

The first slit SI1 is arranged between the second slits SI2, and extends from an uppermost surface of the gate stacked body GST to a bottom surface of the first and second upper stacked bodies STb1 and STb2. The first slit SI1 is arranged on top of the lower stacked body STa. The second slits SI2 are formed deeper than the first slit SI1 and extend to such a depth as completely dividing the gate stacked body GST into two or more separate pieces. That is, the second slits SI2 extend to a bottom surface of the lower stacked body STa.

The semiconductor device of the embodiment of the present disclosure may further include support pillars SP which are arranged along a direction of the first slit SI1 and spaced apart from each other. The support pillars SP may have the same length as the channel pillars CPL1 to CPLn each of which penetrates the gate stacked body GST in a third direction III. The third direction III is a direction in which each of the channel pillars CPL1 to CPLn extends.

The gate stacked body GST may include cell strings CST. Each of the cell strings CST may include memory cells stacked along any one of the channel pillars CPL1 to CPLn.

A first pillar group includes first to $N^{th}$ channel pillars CPL1 to CPLn each of which penetrates the first upper stacked body STb1 and the lower stacked body STa. A second pillar group includes first to $N^{th}$ channel pillars CPL1 to CPLn each of which penetrates the second upper stacked body STb2 and the lower stacked body STa. The first to $N^{th}$ channel pillars CPL1 to CPLn of each of the first pillar group and the second pillar group are arranged in zig-zag form in the first direction I. N is a positive integer. For example, N is a natural number of 4 or above, and N may vary depending on the design of the semiconductor device.

The first channel pillars CPL1 and the $N^{th}$ channel pillars CPLn are arranged along the boundary of the first upper stacked body STb1 and the second upper stacked body STb2. For example, the first channel pillars CPL1 may be arranged along each boundary of the first and second upper stacked bodies STb1 and STb2 adjacent to the second slits SI2. The $N^{th}$ channel pillars CPLn may be arranged along each boundary of the first and second upper stacked bodies STb1 and STb2 adjacent to the first slit SI1. That is, the first to $N^{th}$ channel pillars CPL1 to CPLn may be arranged along the first direction I from the second slits SI2 towards the first slit SI1 sequentially.

For example, the first channel pillars CPL1 may be arranged along each boundary of the first and second upper stacked bodies STb1 and STb2 adjacent to the first slit SI1. The $N^{th}$ channel pillars CPLn may be arranged along each boundary of the first and second upper stacked bodies STb1 and STb2 adjacent to the second slits SI2. That is, the first to $N^{th}$ channel pillars CPL1 to CPLn may be arranged along the first direction I from the first slit SI1 towards the second slits SI2, sequentially.

Hereinafter, in the following embodiment, the first channel pillars CPL1 are arranged adjacent to the second slits SI2, and the $N^{th}$ channel pillars CPLn are arranged adjacent to the first slit SI1. But, the present invention is not limited thereto.

The first to $N^{th}$ channel pillars CPL1 to CPLn are arranged symmetrically around any one of the first slit SI1 and the second slits SI2.

The first to $N^{th}$ channel pillars CPL1 to CPLn may form rows in the second direction II. Each row of the second to $N-1^{th}$ channel pillars CPL2 to CPLn-1 along the second direction II is arranged between the row of the first channel pillars CPL1 and the row of the $N^{th}$ channel pillars CPLn. Center axes along the first direction I of odd number channel pillars CPL1 and CPLn-1 arranged along the first direction I may be arranged on a same line. Center axes along the first direction I of even number channel pillars CPL2 and CPLn arranged along the first direction I may be arranged on a same line.

The first to $N^{th}$ channel pillars CPL1 to CPLn of the first pillar group are surrounded by the interlayer insulating layers ILD and the conductive patterns CP constituting the first upper stacked body STb1, and the second to $N^{th}$ channel pillars CPL1 to CPLn of the second pillar group are surrounded by the interlayer insulating layers ILD and the conductive patterns CP constituting the second upper stacked body STb2. The interlayer insulating layers ILD and the conductive patterns CP constituting each lower stacked body STa surround the first to $N^{th}$ channel pillars CPL1 to CPLn of the first pillar group and the first to $N^{th}$ channel pillars CPL1 to CPLn of the second pillar group.

As the first to $N^{th}$ channel pillars CPL1 to CPLn are arranged in zig-zag form, the degree of integration of the memory cells may be increased. Each of the first to $N^{th}$ channel pillars CPL1 to CPLn may include a core insulating layer CO, a capping conductive layer CAP arranged on the core insulating layer CO, and a channel layer CH surrounding the core insulating layer CO and the capping conductive layer CAP. The channel layer CH may be formed to open a bottom surface of the core insulating layer CO as illustrated in FIG. 1A, or to extend along the bottom surface of the core insulating layer CO as illustrated in FIG. 1B. Otherwise, the core insulating layer CO and the capping conductive layer CAP may be omitted. When the core insulating layer CO and the capping conductive layer CAP are not formed, the channel layer CH may completely fill each of the first to $N^{th}$ channel pillars CPL1 to CPLn.

The channel layer CH may be made of a semiconductor layer. For example, the channel layer CH may be made of an undoped silicon layer or a doped silicon layer. The capping conductive layer CAP may be made of a semiconductor layer and include a dopant of a higher concentration than the channel layer CH. For example, the capping conductive layer CAP may be made of a doped silicon layer. The capping conductive layer CAP may be used as a junction of the cell string CST.

Each of the first and second upper stacked bodies STb1 and STb2 may include conductive patterns CP of one layer, or two or more layers. The conductive patterns CP of each of the first and second upper stacked bodies STb1 and STb2 may be used as upper select lines USL. Each of the lower stacked bodies STa may include conductive patterns CP serving as lower selected lines LSL and conductive patterns CP serving as word lines WL. A lowermost conductive pattern CP of the gate stacked body GST may serve as the lower selected line LSL, or two or more conductive patterns CP arranged below the word lines WL may serve as the lower select lines LSL. The word lines WL may correspond to the conductive patterns stacked between the lower select lines LSL and the upper select lines USL. A source line SL may be arranged below the gate stacked body GST.

As illustrated in FIG. 1A, the source line SL may contact bottom surfaces of the first to $N^{th}$ channel pillars CPL1 to CPLn. More specifically, the source line SL may be electrically connected to a bottom surface of each channel layer CH of the first to $N^{th}$ channel pillars CPLn. The source layer SL may be a portion of a semiconductor substrate to which impurities have been doped, or a doped silicon layer formed on a semiconductor substrate. An outer wall of the channel layer CH may be surrounded by a memory layer ML.

The memory layer ML may be formed as a multilayer that includes a tunnel insulating layer, a data storage layer, and a blocking insulating layer. The tunnel insulating layer may contact the outer wall of the channel layer CH, and may be formed along the outer wall shape of the channel layer CH. The data storage layer may contact the outer wall of the tunnel insulating layer, and may be formed along the outer wall shape of the tunnel insulating layer. The blocking insulating layer may contact the outer wall of the data storage layer, and may be formed along the outer wall of the data storage layer. Although not illustrated in the drawings, the memory layer ML may be formed along a side wall, an upper surface and a lower surface of each of the conductive patterns CP, the side wall disposed adjacent to the channel layer CH. In this case, the memory layer ML may be divided by the first and second slits SI1, SI2, and have a C-shaped cross section.

As illustrated in FIG. 1B, the source line SL may include a first source layer SL1 and a second source layer SL2 arranged on the first source layer SL1. The first source layer SL1 may surround the bottom ends of the first to $N^{th}$ channel pillars CPL1 to CPLn. That is, the bottom ends of the first to $N^{th}$ channel pillars CPL1 to CPLn may extend towards the inside of the first source layer SL1. More specifically, the bottom ends of the core insulating layer CO and the channel layer CH of each of the first to $N^{th}$ channel pillars CPL1 to CPLn may be surrounded by the first source layer SL1.

A second source layer SL2 is arranged between the first source layer SL1 and first and second stacked structures ST1 and ST2. The second source layer SL2 may contact the channel layer CH of each of the first to $N^{th}$ channel pillars CPL1 to CPLn. The second source layer SL2 may contact the first source layer SL1. The first source layer SL1 and the second source layer SL2 may be made of a doped silicon layer.

The outer wall of each of the first to $N^{th}$ channel pillars CPL1 to CPLn may be surrounded by a first memory pattern ML1 and a second memory pattern ML2. Each of the first memory pattern ML1 and the second memory pattern ML2 may include the tunnel insulating layer, the data storage layer and the block insulating layer. The tunnel insulating layer CH may contact the outer wall of the channel layer CH, and may be formed along the outer wall of the tunnel insulating layer. The blocking insulating layer may contact the outer wall of the data storage layer, and may be formed along the outer wall of the data storage layer.

The first memory pattern ML1 surrounds an outer wall of an upper portion of the channel layer CH which protrudes into the gate stacked body GST. That is, the first memory pattern ML1 is arranged between the channel layer CH and the gate stacked body GST. The second memory pattern ML2 is arranged between the first source layer SL1 and the channel layer CH. The first memory pattern ML1 and the second memory pattern ML2 may be spaced apart from each other by the second source layer SL2.

According to the structure mentioned with reference to FIG. 1A and FIG. 1B, the memory cells are formed on intersecting parts of the channel layer CH and the word lines WL, the lower select transistor is formed on an intersecting part of the channel layer CH and the lower select line LSL, and the upper select transistor is formed on an intersecting part of the channel layer CH and the upper select line USL. The lower select transistor, the memory cells and the upper select transistor arranged in a line along one channel layer CH are connected in series by the channel layer CH and define the cell string CST. The word lines WL may transmit a signal to gates of the memory cells, the lower select line LSL may transmit a signal to a gate of the lower select transistor, and the upper select line USL may transmit a signal to a gate of the upper select transistor.

The semiconductor devices described with reference to FIG. 1A and FIG. 1B include a 3-dimensional cell string CST. The 3-dimensional cell string CST may be connected to the bit line by any one channel layer CH among the first to $N^{th}$ channel pillars CPL1 to CPLn. The present disclosure provides various embodiments for securing an arrangement margin of the bit lines which are respectively connected to the first to $N^{th}$ channel pillars CPL1 to CPLn of the first pillar group in zig-zag form, or respectively connected to the first to $N^{th}$ channel pillars CPL1 to CPLn of the second pillar group in zig-zag form.

Although not illustrated in the drawings, the first slit SI1 may be formed to have a same depth as the second slits SI2. The first slit SI1 may penetrate the lower stacked body STa and extend to the bottom surface of the lower stacked body STa.

Figure 2:
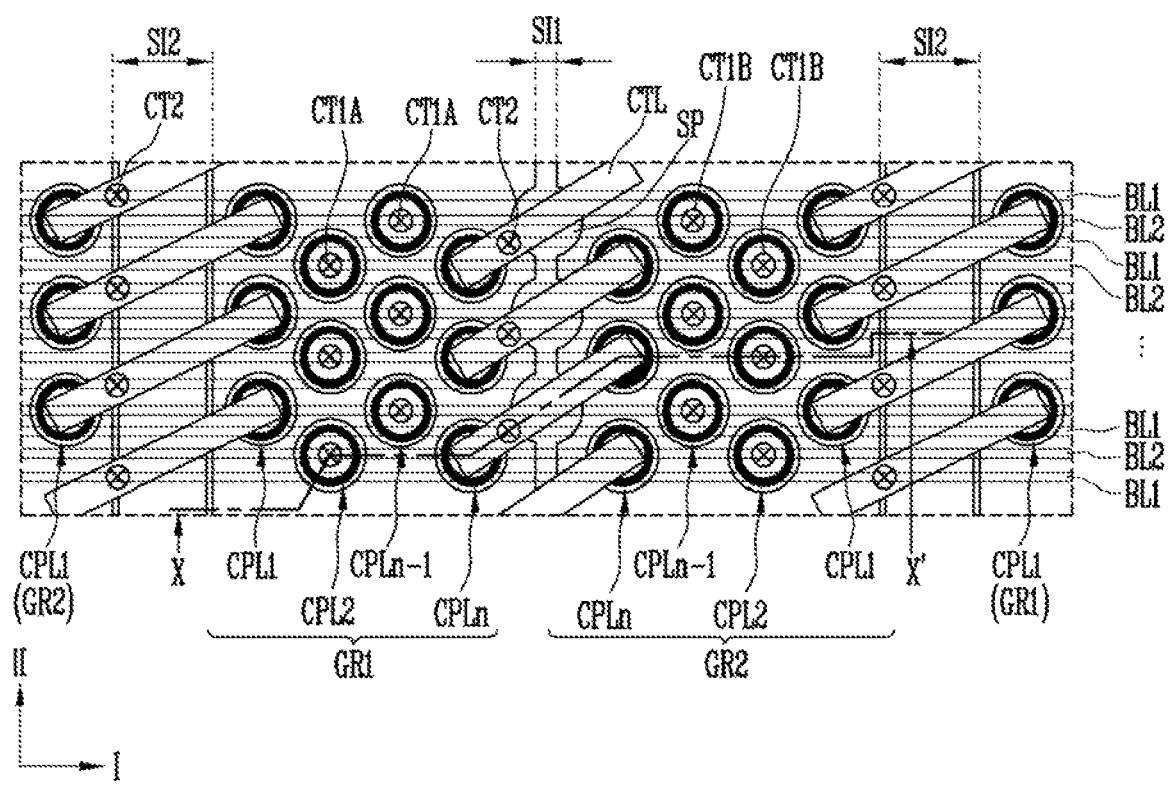
FIG. 2 is a view of a layout illustrating a connection relationship between channel pillars and bit lines of a semiconductor according to an embodiment of the present disclosure.

FIG. 2 is a view of a layout illustrating a connection relationship between channel pillars and bit lines of a semiconductor according to an embodiment of the present disclosure. Referring to FIG. 2, the semiconductor device according to the embodiment of the present disclosure may further include a first plug group and a second plug group. The first plug group includes first contact plugs CT1A and the second plug group includes second contact plugs CT1B. The first contact plugs CT1A are respectively connected to an upper portion of a second to N-1$^{th}$ channel pillars CPL2 to CPLn-1 of a first pillar group GR1. The second contact plugs CT1B are respectively connected to an upper portion of a second to N-1$^{th}$ channel pillars CPL2 to CPLn-1 of a second pillar group GR2. The second to N-1$^{th}$ channel pillars CPL2 to CPLn-1 of the first pillar group GR1 may be arranged between the first channel pillar CPL1 of the first pillar group GR1 and the N$^{th}$ channel pillar CPLn of the first pillar group GR1. The second to N-1$^{th}$ channel pillars CPL2 to CPLn-1 of the second pillar group GR2 may be arranged between the first channel pillar CPL1 of the second pillar group GR2 and the N$^{th}$ channel pillar CPLn of the second pillar group GR2.

The first contact plugs CT1A are arranged in zig-zag form in the first direction I along the arrangement of the second to N-1$^{th}$ channel pillars CPL2 to CPLn-2 of the first pillar group GR1, and are formed to have narrower diameters than the second to N-1$^{th}$ channel pillars CPL2 to CPLn-1 of the first pillar group GR1. The second contact plugs CT1B are arranged in zig-zag form in the first direction I along the arrangement of the second to N-1$^{th}$ channel pillars CPL2 to CPLn-1 of the second pillar group GR2, and are formed to have narrower diameters than the second to N-1$^{th}$ channel pillars CPL2 to CPLn-1 of the second pillar group GR2.

The semiconductor device according to the embodiment of the present disclosure further includes contact lines CTL. Some of the contact lines CTL overlap the first slit SI1, and the others overlap the second slits SI2. Each of the contact lines CTL that overlap the second slits SI2 is formed as a bar type extending in a diagonal direction such that it connects the first channel pillar CPL1 of the first pillar group GR1 and the first channel pillar CPL1 of the second pillar group GR2 arranged in the diagonal direction with respect to the first direction I and the second direction II. Each of the contact lines CTL overlapping the first slit SI1 is formed as a bar type extending in the diagonal direction such that it connects the N$^{th}$ channel pillar CPLn of the first pillar group GR1 and the N$^{th}$ channel pillar CPLn of the second pillar group GR2 arranged in the diagonal direction with respect to the first direction I and the second direction II. That is, the N$^{th}$ channel pillars CPLn of two rows adjacent to the first slits SI1 may be connected in pairs by the contact lines CTL. The first channel pillars CPL1 of two rows adjacent to each second slit SI2 may be connected in pairs by the contact lines CTL. The contact lines CTL overlapping the first slit SI1 may overlap the support pillars SP. Since the contact lines CTL are formed in shapes of straight line bars when viewed from a plane view, the process difficulty of manufacturing the contact lines CTL may be reduced when compared to manufacturing curved contact lines.

The first contact plugs CT1A may be electrically connected to the second to N-1$^{th}$ channel pillars CPL2 to CPLn-1 of the first pillar group GR1, respectively. The second contact plugs CT1B may be electrically connected to the second to N-1$^{th}$ channel pillars CPL2 to CPLn-1 of the second pillar group GR2, respectively. The contact lines CTL may be electrically connected to the first and N$^{th}$ channel pillars CPL1 to CPLn of the first pillar group GR1 and the second pillar group GR2. The third contact plugs CT2 may each be electrically connected to the contact lines CTL.

A first axis extending in the first direction I and across a center of each of the third contact plugs CT2 may not coincide with a second axis extending in the first direction I and across a center of each of the first and second contact plugs CT1A and CT1B.

The semiconductor device according to the embodiment of the present disclosure may further include bit lines BL1 and BL2 extending in the first direction I. The bit lines may include first bit lines BL1 and second bit lines BL2 arranged alternately along the second direction II. The second bit lines BL2 may be connected to the first and second contact plugs CT1A and CT1B, and the first bit lines BL1 may be connected to the third contact plugs CT2.

Each of the first and second bit lines BL1, BL2 may extend along the first direction I that intersects the contact lines CTL. The first bit lines BL1 and the second bit lines BL2 are arranged alternately in the second direction II, and thus one first bit line BL1 may be arranged between the second bit lines BL2 neighboring each other in the second direction II. The second bit lines BL2 are connects to the first contact plugs CT1A, respectively. The second bit lines BL2 estend in the first direction I to be connected to the second contact plugs CT1B, respectively.

Connection structures for electrically connecting the contact lines CTL and the first and $N^{th}$ channel pillars CPL1 and CPLn of the first pillar group GR1 and the second pillar group GR2, or electrically connecting the first and second contact plugs CT1A and CT1B and the second to N-1$^{th}$ channel pillars CPL2 and CPLn-1 of the first pillar group GR1 and the second pillar group GR2 arranged in the layout described in FIG. 2 may be designed in various structures. Further, the configuration of the material layers filling the inside of the second slits SI2 may vary. Specific structures of such configurations will be described with reference to FIGS. 3A to 3C hereinafter.

According to the layout described with reference to FIG. 2, the contact lines CTL extend to intersect in a diagonal direction with respect to the first direction I. The third contact plugs CT2 may not overlap the first to $N^{th}$ channel pillars CPL1 to CPLn of the first pillar group GR1 and the second pillar group GR2, but may overlap a portion of the areas of the contact lines CTL. Even if the third contact plugs CT2 are outside the area where the first and $N^{th}$ channel pillars CPL1 and CPLn of the first pillar group GR1 and the second pillar group GR2 are arranged, the third contact plugs CT2 may be electrically connected to the first and $N^{th}$ channel pillars CPL1 and CPLn of the first pillar group GR1 and the second pillar group GR2 via the contact lines CTL.

According to the embodiment of the present disclosure, the first axis extending along the first direction I and across the center of the third contact plug CT2 may not overlap the second axis extending along the first direction I and across the center of each of the first and second contact plugs CT1A and CT1B. Thus, the embodiment of the present disclosure may broaden the arrangement pitch of the bit lines that include the first bit lines BL1 and the second bit lines BL2. Consequently, the embodiment of the present disclosure may reduce the process difficulty of photolithography for forming the bit lines.

Since the embodiment of the present disclosure forms the contact lines CTL in shapes of straight line bars, it is possible to reduce the bridge phenomenon between contact lines that may occur when forming curved contact lines.

Figure 3A:
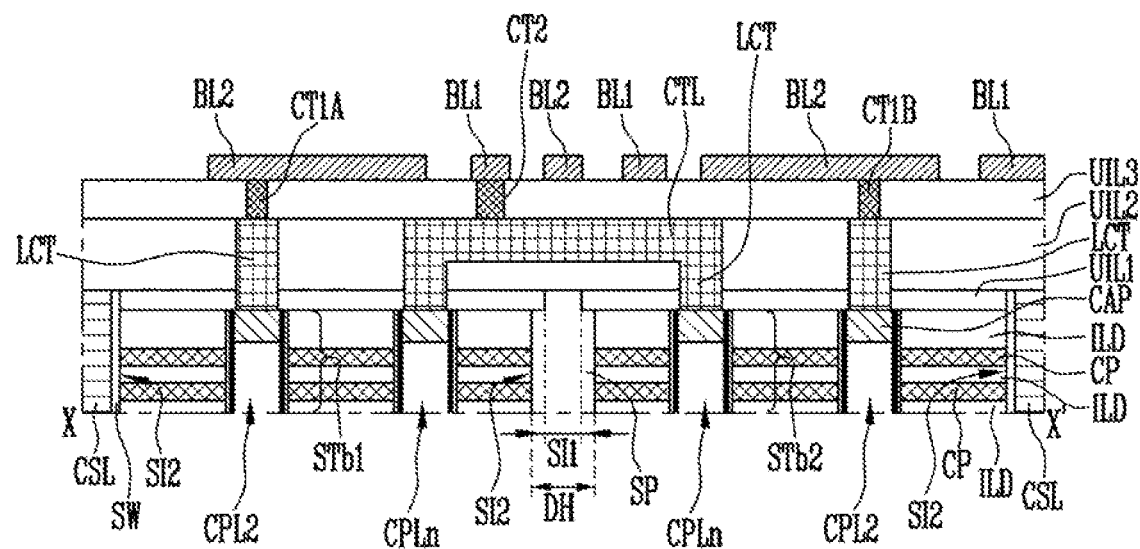
FIG. 3A to FIG. 3C are cross-sectional views illustrating a connection relationship between channel pillars and bit lines of a semiconductor device according to an embodiment of the present disclosure.
Figure 3B:
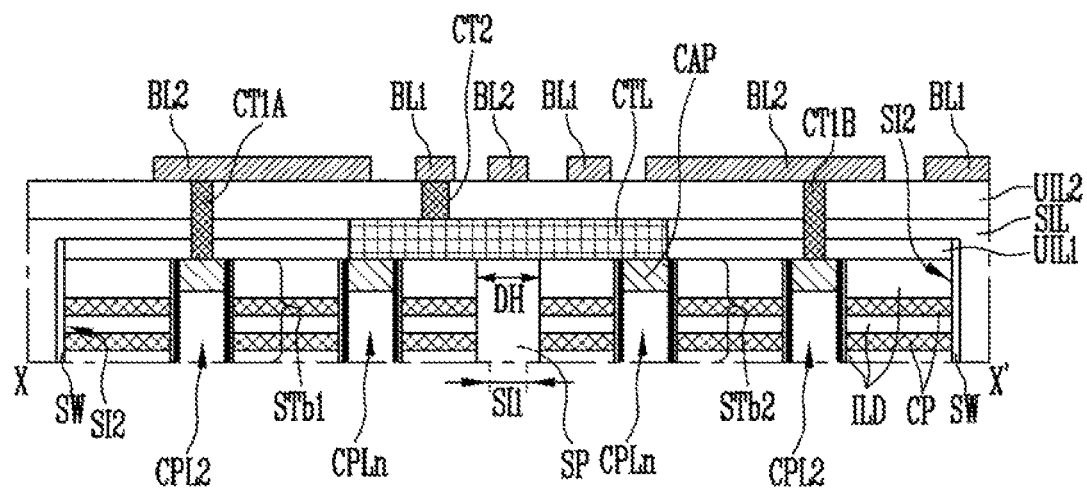
Figure 3C:
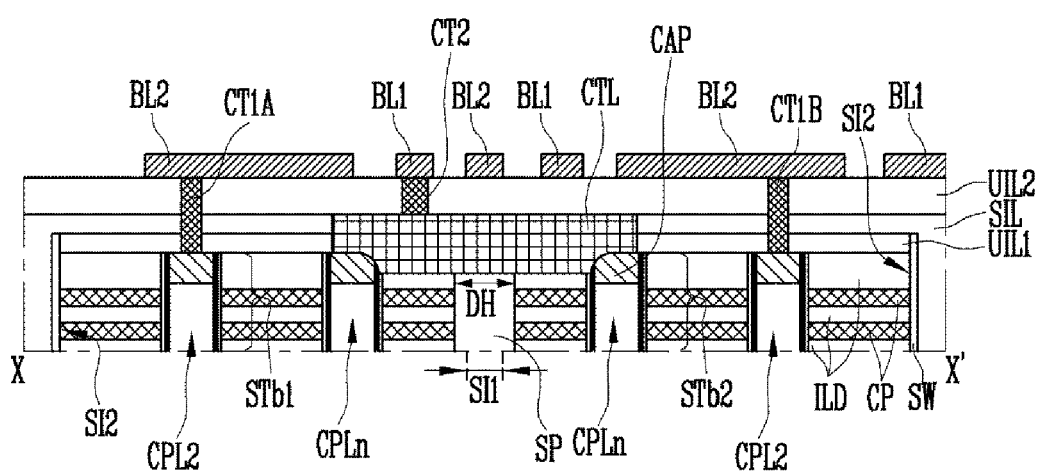

FIG. 3A to FIG. 3C are cross-sectional views illustrating a connection relationship between the channel pillars and the bit lines of the semiconductor device according to an embodiment of the present disclosure. FIG. 3A to FIG. 3C are cross-sectional views taken along the line X-X' illustrated in FIG. 2. FIG. 3A to FIG. 3C are views of the first and second upper stacked bodies of the gate stacked body and the structures arranged thereon.

Referring to FIG. 3A, the first contact plug CT1A of the first plug group arranged on top of the first upper stacked body STb1, the second contact plug CT1B of the second plug group arranged on top of the second upper stacked body STb2, and the contact lines CTL may contact the lower contact plugs LCT, respectively. The lower contact plugs LCT extend from the lower surfaces of the first and second contact plugs CT1A and CT1B and the contact lines CTL, towards the first to $N^{th}$ channel pillars of the first pillar group (CPL1 and CPLn of GR1 illustrated in FIG. 2) penetrating the first upper stacked body STb1, and towards the first to $N^{th}$ channel pillars of the second pillar group (CPL1 and CPLn of GR2 illustrated in FIG. 2) penetrating the second upper stacked body STb2. The first and second contact plugs CT1A and CT1B may be electrically connected to the second to N-1$^{th}$ channel pillars of the first pillar group and the second pillar group (CPL2 to CPLn-1 of GR1 and GR2 illustrated in FIG. 2) via the lower contact plugs LCT.

The contact lines CTL may be electrically connected to the first and $N^{th}$ channel pillars of the first pillar group and the second pillar group (CPL1 and CPLn of GR1 and GR2 illustrated in FIG. 2) via the lower contact plugs LCT. The lower contact plugs LCT may contact the capping conductive layer CAP of each of the first to $N^{th}$ channel pillars of the first pillar group and the second pillar group (CPL1 to CPLn of GR1 and GR2 illustrated in FIG. 2).

The inside of each second slit SI2 penetrating the interlayer insulating layers ILD and the conductive patterns CP stacked alternately may be filled with a common source line CSL. The side wall insulating layer SW may be formed on a side wall of the common source line CSL. The interlayer insulating layers ILD and the conductive patterns CP between the second slits ST2 may be penetrated by a dummy hole DH, and the first slit SI1 may be arranged across the dummy hole DH. The first slit SI1 may extend inside the dummy hole DH completely through the first and second upper stacked bodies ST1a and ST1b. The first slit SI1 and the dummy hole DH may be filled with an insulating material, and the insulating material filling the dummy hole DH may be used as the support pillar SP.

First to third upper insulating layers UIL1 to UIL3 may be stacked on the interlayer insulating layers ILD and the conductive patterns CP, sequentially. The first upper insulating layer UIL1 may be penetrated by each second slit SI2, the common source line CSL and the side wall insulating layer SW formed inside of each of the second slit SI2 and the first slit SI1.

The second upper insulating layer UIL2 arranged on the first upper insulating layer UIL1 may cover the common source line CSL. The lower contact plugs LCT may penetrate the first and second upper insulating layers UIL1 and UIL2, and contact the first to $N^{th}$ channel pillars of the first pillar group and the second pillar group (CPL1 to CPLn of GR1 and GR2 of FIG. 2). The contact lines CTL may be formed inside the second upper insulating layer UIL2, and contact a portion of the lower contact plugs LCT.

The third upper insulating layer UIL3 arranged on the second upper insulating layer UIL2 may cover the contact lines CTL and the lower contact plugs LCT. The first and second contact plugs CT1A and CT1B may penetrate the third upper insulating layer UIL3 and contact the lower contact plugs LCT, and the third contact plugs CT2 may penetrate the third upper insulating layer UIL3 and contact the contact lines CTL. The first and second bit lines BL1 and BL2 are arranged on the third upper insulating layer UIL3. The first bit lines BL1 contact the third contact plugs CT2, and the second bit lines BL2 contact the first and second contact plugs CT1A and CT1B.

According to the aforementioned structure, the first and second contact plugs CT1A and CT1B and the third contact plugs CT2 may have the same height.

Referring to FIG. 3B and FIG. 3C, the first contact plugs CT1A arranged on top of the first upper stacked body STb1 may directly contact the second to N-1$^{th}$ channel pillars of the first pillar group (CPL2 to CPLn-1 of GR1 illustrated in FIG. 2). The second contact plugs CT1B arranged on top of the second upper stacked body STb2 may directly contact the second to N-1$^{th}$ channel pillars of the second pillar group (CPL2 to CPLn-1 of GR2 illustrated in FIG. 2). The contact lines CTL may directly contact the first and $N^{th}$ channel pillars of the first pillar group and the second pillar group (CPL1 and CPLn of GR1 and GR2 illustrated in FIG. 2).

That is, the first and second contact plugs CT1A and CT1B and the contact lines CTL are directly connected to the first to $N^{th}$ channel pillars of the first pillar group and the second pillar group (CPL1 to CPLn of GR1 and GR2 illustrated in FIG. 2), rather than via the lower contact plugs. The first and second contact plugs CT1A and CT1B and the contact lines CTL may contact the capping conductive layer CAP of each of the first to $N^{th}$ channel pillars of the first pillar group and the second pillar group (CPL1 to CPLn of GR1 and GR2 illustrated in FIG. 2).

The first and second upper insulating layers UIL1 and UIL2 may be stacked on the interlayer insulating layers ILD and the conductive patterns CP stacked alternately. The first upper insulating layer UIL1 may be penetrated by the first slit SI1, each second slit SI2, and the contact line CTL.

The slit insulating layer SIL may fill the inside of the second slit SI2. The slit insulating layer SIL may extend between the first upper insulating layer UIL1 and the second upper insulating layer UIL2 so that it covers the first upper insulating layer UIL1. A side wall insulating layer SW may be further formed between the side wall of each second slit SI2 and the slit insulating layer SIL. The interlayer insulating layers ILD and the conductive patterns CP between the second slits SI2 may be penetrated by the dummy hole DH, and may be arranged across the dummy hole DH.

The first slit SI1 in the dummy hole DH may extend to the same depth as the first and second upper stacked bodies ST1a and ST1b. The first slit SI1 and the dummy hole DH may be filled with an insulating material, and the insulating material filling the dummy hole DH may serve as the support pillar SP.

The contact lines CTL may penetrate the slit insulating layer SIL and the first upper insulating layer UIL1, and contact the first channel pillars of the first pillar group and the second pillar group (CPL1 of GR1 and GR2 illustrated in FIG. 2) and the $N^{th}$ channel pillars of the first pillar group and the second pillar group (CPLn of GR1 and GR2 illustrated in FIG. 2).

Referring to FIG. 3B, the contact lines CTL may contact the upper surfaces of the first and $N^{th}$ channel pillars of the first pillar group and the second pillar group (CPL1 and CPLn of GR1 and GR2 illustrated in FIG. 2). More specifically, each of the contact lines CTL may contact the upper surface of the capping conductive layer CAP.

Referring to FIG. 3C, the contact lines CTL may contact the upper surfaces and the side walls of the first and $N^{th}$ channel pillars of the first pillar group and the second pillar group (CPL1 and CPLn of GR1 and GR2 illustrated in FIG. 2). Each of the contact lines CTL may directly contact the upper surface and the side wall of the capping conductive layer CAP and the side wall of the channel layer CH. In this case, each of the contact lines CTL may extend towards the inside of the first upper stacked body STb1 and the second upper stacked body STb2 between the first channel pillars of the first pillar group and the second pillar group, or extend towards the inside of the first upper stacked body STb1 and the second upper stacked body STb2 between the $N^{th}$ channel pillars CPLn of the first pillar group and the second pillar group neighboring each other. In this case, the contact lines CTL may contact the first and $N^{th}$ channel pillars of the first pillar group and the second pillar group (CPL1 and CPLn of GR1 and GR2 illustrated in FIG. 2) by a large surface area.

Referring to FIG. 3B and FIG. 3C, the second upper insulating layer UIL2 is formed to cover the contact lines CTL on the slit insulating layer UIL1. The first and second contact plugs CT1A and CT1B may penetrate the second upper insulating layer UIL2, the slit insulating layer SIL and the first upper insulating layer UIL1, and contact the second to N-1$^{th}$ channel pillars of the first pillar group and the second pillar group (CPL2 to CPLn-1 of GR1 and GR2 illustrated in FIG. 2). The third contact plugs CT2 may penetrate the second upper insulating layer UIL2 and contact the contact lines CTL. The first and second bit lines BL1, BL2 are arranged on the second upper insulating layer UIL2. The second bit lines BL2 contact the first and second contact plugs CT1A and CT1B, and the first bit lines BL1 contact the third contact plugs CT2.

According to the aforementioned structure, the first and second contact plugs CT1A and CT1B may extend longer than the third contact plugs CT2, and directly contact the second to N-1$^{th}$ channel pillars of the first pillar group and the second pillar group (CPL2 to CPLn-1 of GR1 and GR2 illustrated in FIG. 2).

In the embodiments illustrated in FIG. 3B and FIG. 3C, the first and second contact plugs CT1A and CT1B directly contact the second channel pillars CPL2 to N-1$^{th}$ channel pillars (CPLn-1 of FIG. 2) without penetrating the lower contact plugs, or the third contact plugs CT2 directly contact the contact lines CTL, unlike in the embodiment illustrated in FIG. 3A. Thus, the manufacturing process of the semiconductor device illustrated in FIG. 3B and FIG. 3C may be simplified. Further, according to the embodiments illustrated in FIG. 3B and FIG. 3C, it is possible to reduce a vertical length of the connecting structure between any one of the first to $N^{th}$ channel pillars (CPL1 to CPLn of FIG. 2) and the bit line (BL1 or BL2) corresponding thereto. Thus, it is possible to reduce a parasitic cap between the connecting structures neighboring each other.

Hereinafter, various embodiments of the method for manufacturing the semiconductor device of the present disclosure will be described with reference to FIGS. 4A to 16. FIGS. 4A to 13B are views illustrating a method for manufacturing the semiconductor device illustrated in FIG. 3A.

Figure 4A:
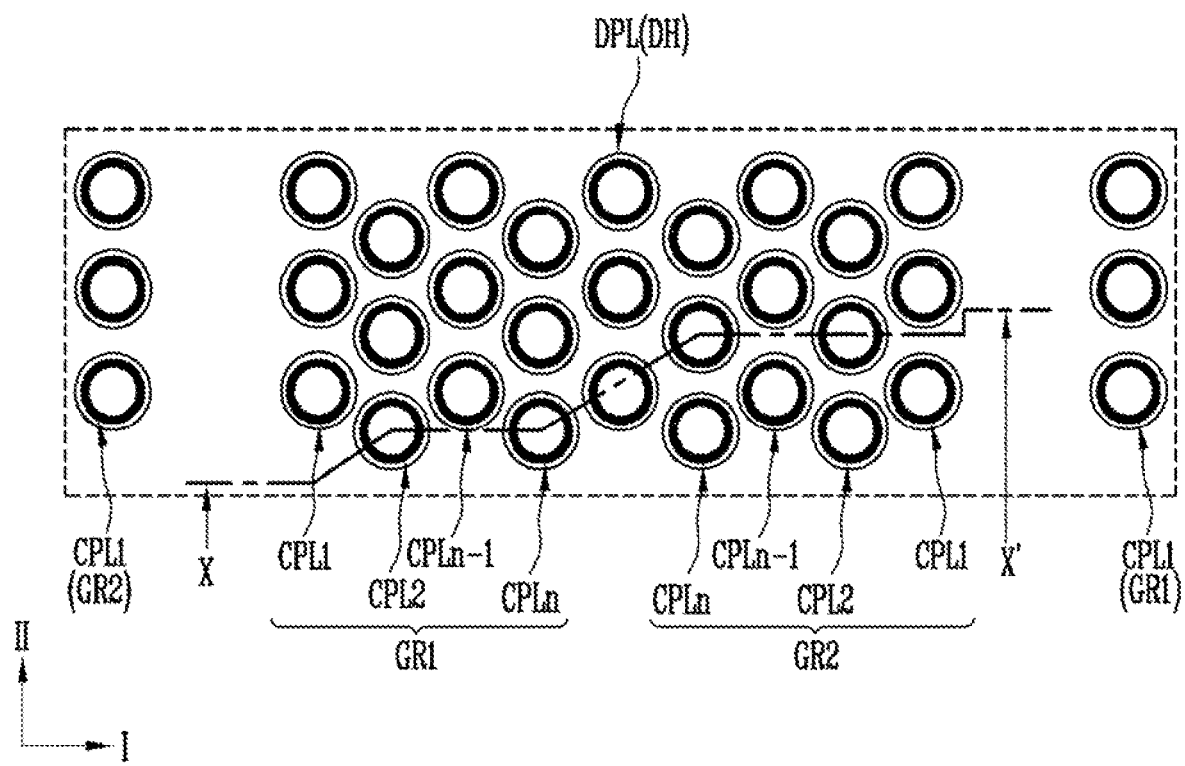
FIG. 4A to FIG. 13B are views illustrating a manufacturing method for a semiconductor device illustrated in FIG. 3A.
Figure 4B:
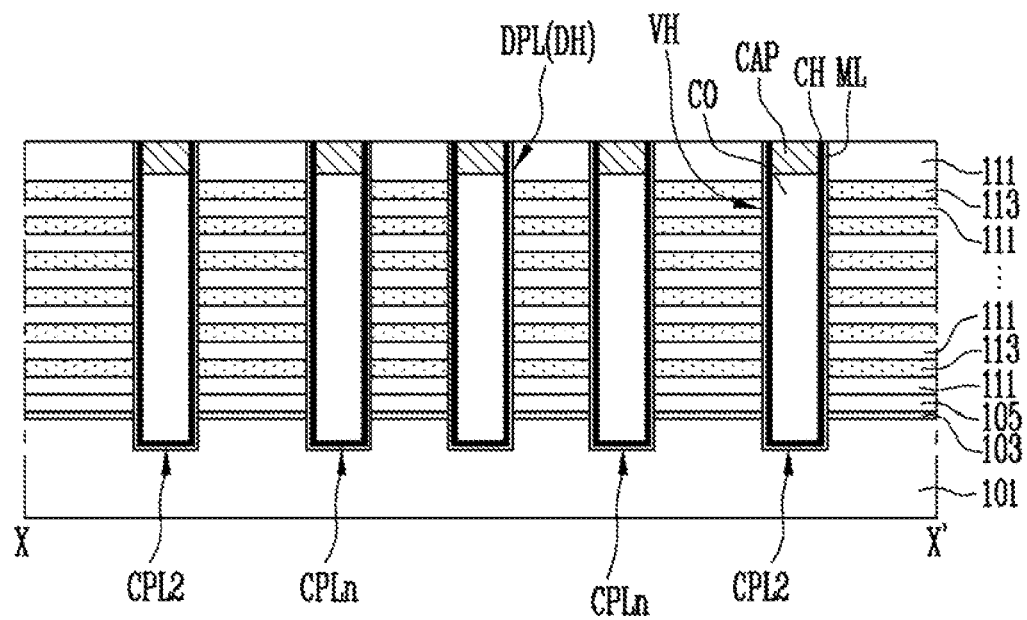

FIG. 4A and FIG. 4B are a plane view and a cross-sectional view illustrating a process of forming the first to $N^{th}$ channel pillars and the dummy pillars. FIG. 4B is a cross-sectional view taken along the line X-X' illustrated in FIG. 4A. Referring to FIG. 4A and FIG. 4B, first material layers 111 and second material layers 113 are stacked alternately on a stacked structure of a first source layer 101, a protection layer 103 and a sacrifice layer 105.

The first source layer 101 may be made of a conductive material. The first source layer 101 may be made of a conductive material and may be used as a growth seed layer of the second source layer 101 in a next step. For example, the first source layer 101 may be made of poly silicon. The first source layer 101 may further include a metal layer arranged on a lower portion of the poly silicon to reduce resistance of the source line. The metal layer may include tungsten.

The protection layer 103 may be made of a material having an etching select ratio different from that of the sacrifice layer 105. For example, the protection layer 103 may be made of an oxide material. The sacrifice layer 105 may be made of a material that may be selectively removed in a subsequent process. For example, the sacrifice layer 105 may be made of poly silicon.

The first material layers 111 may be formed on areas where the interlayer insulating layers are arranged, and the second material layers 113 may be formed on areas where the conductive patterns are arranged. The second material layers 113 are made of a material different from the first material layers 111. For example, the first material layers 111 may be made of an insulating material for interlayer insulating layer usage, and the second material layers 113 may be made of a conductive material for conductive pattern usage.

In another embodiment, the first material layers 111 may be made of an insulating material for interlayer insulating layer usage, and the second material layers 113 may be made of an insulating layer for sacrificial usage and has an etch select ratio for the first material layers 111. In this case, the first material layers 111 may be made of a silicon oxide layer, and the second material layers 113 may be made of a silicon nitride layer. When both the first and second material layers 111, 113 are made of an insulating group material, it is easy to form a vertical hole VH, a dummy hole DH, and second slits.

In yet another embodiment, the first material layers 111 may be made of a conductive material for sacrificial usage and have an etch select ratio for the second material layers 113, and the second material layers 113 may be made of a conductive material for conductive pattern usage. In this case, the first material layers 111 may be made of an undoped poly silicon layer, and the second material layers 113 may be made of a doped poly silicon layer. When both the first and second material layers 111, 113 are made of a silicon group material, it is easy to perform an etching process for forming a hole or a slit.

Hereinafter, a description will be made when the first material layers 111 are made of an insulating material for interlayer insulating layer usage, and the second material layers 113 are made of an insulating material for sacrificial usage, but there is no limitation thereto.

The first material layers 111 and the second material layers 113 are etched to form the vertical holes VH and dummy holes DH penetrating the first material layers 111 and the second material layers 113. To form the vertical holes VH and the dummy holes DH, it is possible to further etch the sacrifice layer 105 and the protection layer 103. Here, a portion of the first source layer 101 may be etched. In such a case, the vertical holes VH and the dummy holes DH may penetrate the sacrifice layer 105 and the protection layer 104, and extend towards inside the first source layer 101. The vertical holes VH may be arranged in zig-zag form along the first direction I. The dummy holes DH may be formed in one, or two or more rows between the vertical holes VH. The vertical holes VH may be arranged symmetrical to the dummy holes DH.

Next, the first to $N^{th}$ channel pillars CPL1 to CPLn surrounded by the memory layer ML are formed inside the vertical holes VH. The first to $N^{th}$ channel pillars CPL1 to CPLn are arranged in zig-zag form along the first direction I. The first to $N^{th}$ channel pillars CPL1 to CPLn may be included in a first pillar group GR1 or in a second pillar group GR2. The first to $N^{th}$ channel pillars CPL1 to CPLn of the first pillar group GR1 and the first to $N^{th}$ channel pillars CPL1 to CPLn of the second pillar group GR2 are arranged alternately in the first direction I, and are symmetrical to each other with respect to an axis extending in the second direction II. The first to $N^{th}$ channel pillars CPL1 to CPLn surrounded by the memory layer ML may be formed by the process described hereinafter.

The memory layer ML is formed on a surface of the vertical holes VH. The memory layer ML may be formed by stacking a blocking insulating layer, a data storage layer and a tunnel insulating layer, sequentially. The blocking insulating layer, the data storage layer and the tunnel insulating layer may be formed on the surface of each of the vertical holes VH. Here, the memory layer ML may be formed on the surface of the dummy holes DH as well. Next, the channel layer CH is formed on the memory layer ML. The channel layer CH may be formed to completely fill the inside of each of the vertical holes VH, or to open the central area of each of the vertical holes VH.

When the central area of each vertical hole VH is opened by the channel layer CH, the central area of each vertical hole VH may be filled with a core insulating layer CO. The core insulating layer CO may be located at a lower level than each of the vertical holes VH. In this case, it is possible to further form the capping conductive layer CAP on the core insulating layer CO and fill the upper end of each vertical hole VH with the capping conductive layer CAP. Thus, the first to $N^{th}$ channel pillars CPL1 to CPLn including the core insulating layer CO and the capping conductive layer CAP are formed. Furthermore, a dummy pillar DPL that includes the channel layer CH, the core insulating layer CO and the capping conductive layer CAP may be formed inside each dummy hole DH.

Figure 5A:
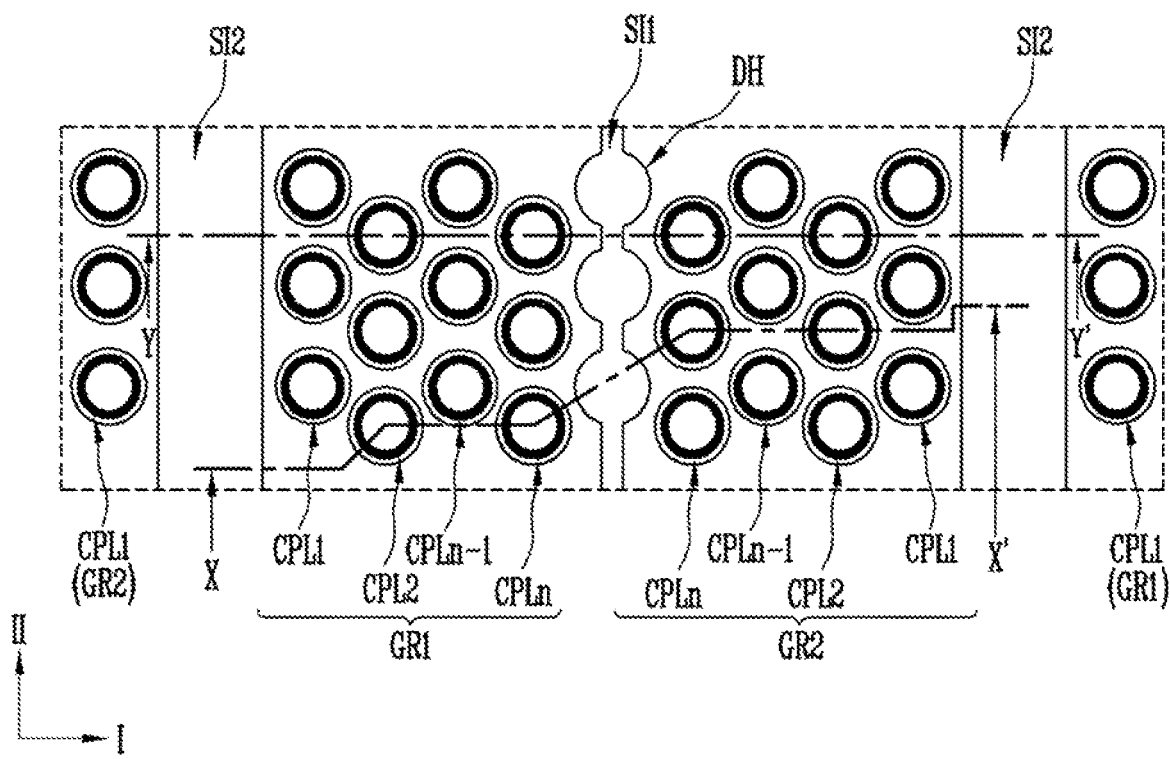
Figure 5B:
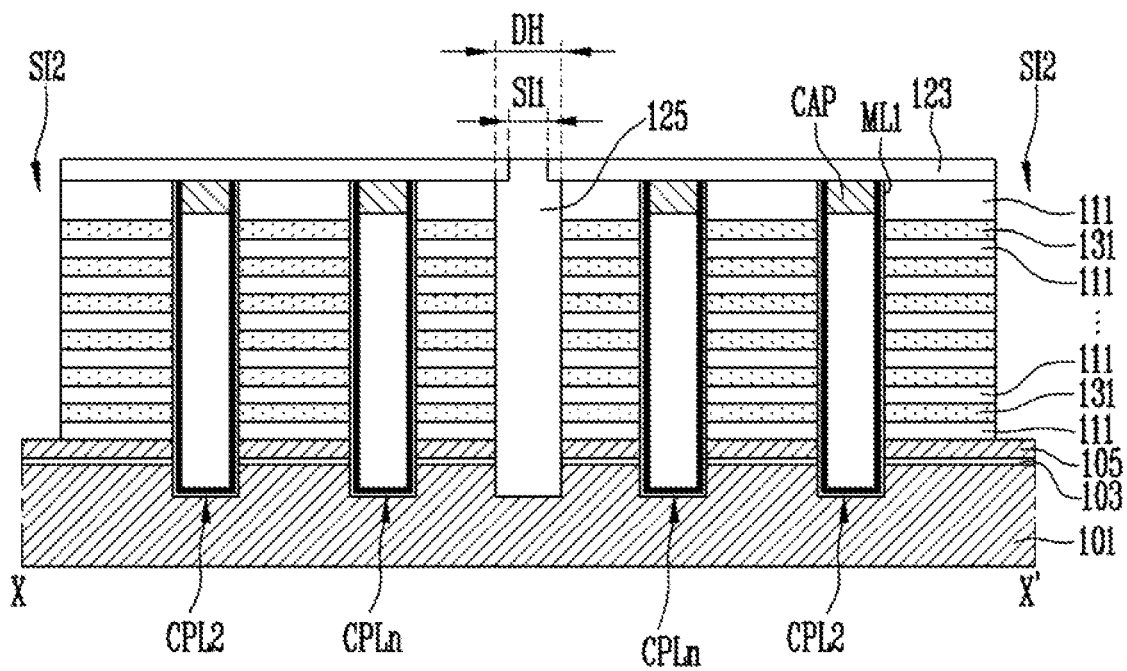
Figure 5C:
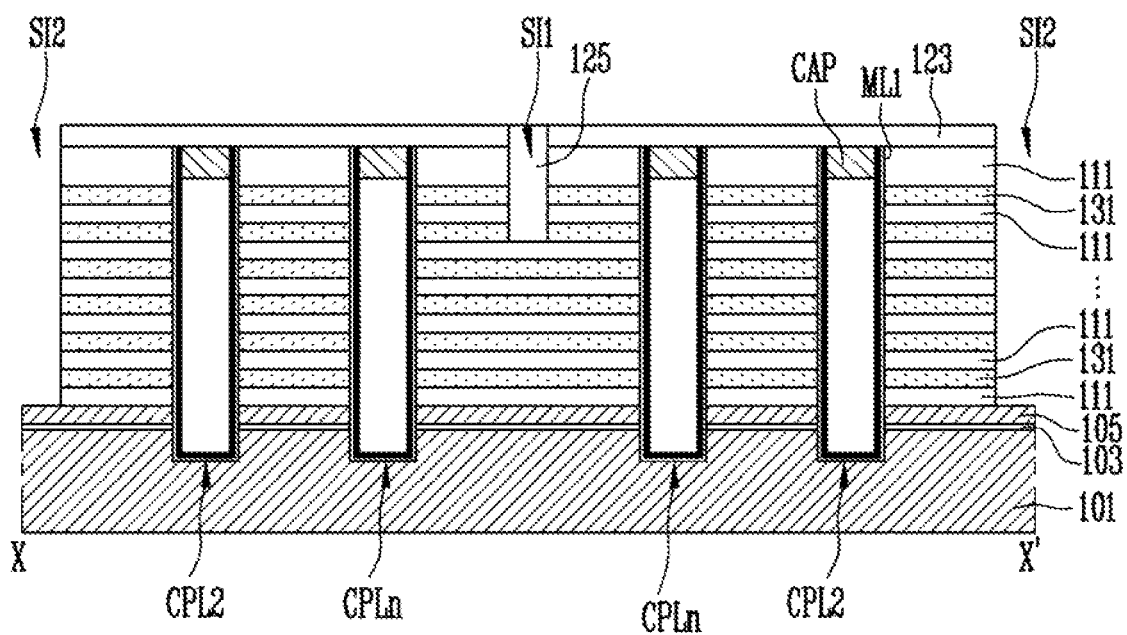

FIG. 5A to FIG. 5C are plane views and cross-sectional views illustrating a process for forming the first and second slits. FIG. 5B is a cross-sectional view taken along the line X-X' illustrated in FIG. 5A, and FIG. 5C is a cross-sectional view taken along the line Y-Y' illustrated in FIG. 5A.

Referring to FIG. 5A to FIG. 5C, the first slit SI1 extending in the second direction II is formed. The first slit SI1 is formed between the $N^{th}$ channel pillar CPLn of the first pillar group GR1 and the $N^{th}$ channel pillar CPLn of the second pillar group GR2, and is formed across the dummy holes DH. The first slit SI1 divides the first upper stacked body and the second upper stacked body, but does not completely penetrate the lower stacked body.

The dummy pillar (DPL of FIG. 4B) arranged inside each dummy hole DH is exposed through the first slit SI1. The dummy pillar (DPL of FIG. 4B) may be removed through the first slit SI1 so that the dummy holes DH may be opened. Thereafter, the first slit SI1 and the dummy holes DH are filled with an insulating material 125. A portion of the areas of the insulating material 125 filling inside the dummy holes DH may serve as the support pillar in a subsequent process.

Although not illustrated in the drawings, the first material layers 111 and the second material layers 113 may be patterned in a stepwise structure prior to forming the first slit SI1. The stepwise structure may be covered by the first upper insulating layer 123 having a flat surface. The first upper insulating layer 123 may extend such that it covers the first material layers 111 and the second material layers 113 being penetrated by the first to $N^{th}$ channel pillars CPL1 to CPLn of the first pillar group GR1 and the second pillar group GR2. The first slit SI1 may further penetrate the first upper insulating layer 123.

After the first slit SI1 and the dummy holes DH are filled with the insulating material 125, the first material layers 111 and the second material layers 113 are etched to form the second slits SI2 that penetrate the first material layers 111 and the second material layers 113. The second slits SI2 may face each other having the first slit SI1 disposed therebetween, and may extend in the second direction II. Each of the second slits SI1 is arranged between the first channel pillar CPL1 of the first pillar group GR1 and the first channel pillar CPL1 of the second pillar group GR2 neighboring each other. The second slits SI2 completely penetrate the first material layers 111 and the second material layers 113.

Figure 6:
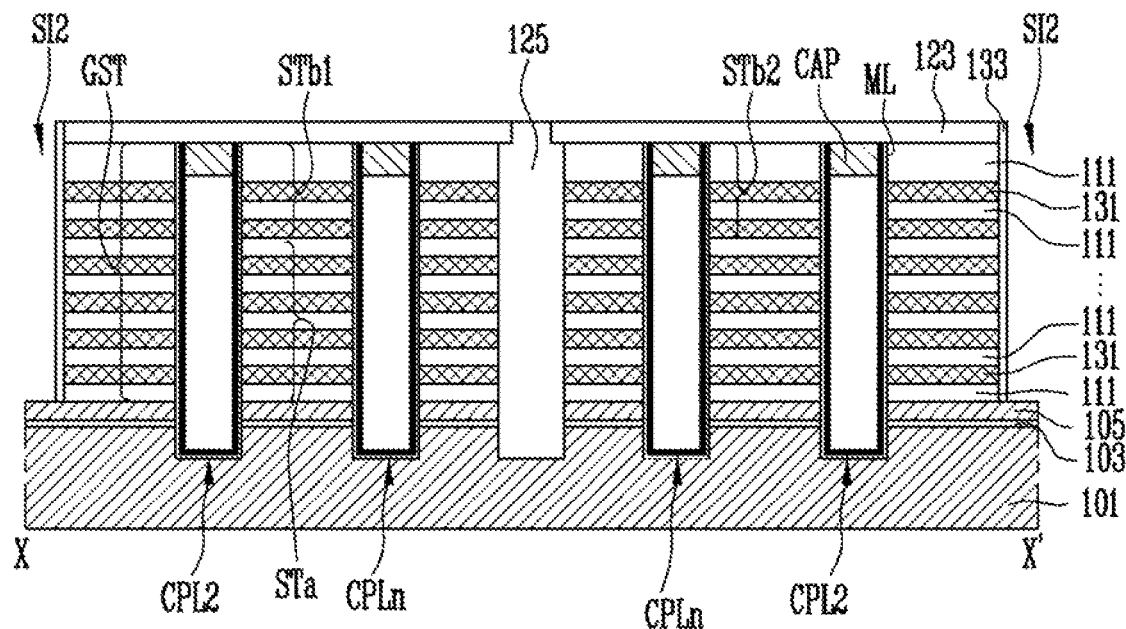

FIG. 6 is a cross-sectional view illustrating a process of replacing the second material layers with the third material layers. FIG. 6 is a cross-sectional view taken along the line X-X' illustrated in FIG. 5A. Referring to FIG. 6, the first material layers 111 are made of the interlayer insulating layers and the second material layers 113 are made of the sacrificial insulating layers. The second material layers 113 may be replaced with the third material layers 131 through the slits SI2. More specifically, the second material layers 113 may be selectively removed through the second slits SI2, and the area from which the second material layers 113 have been removed may be filled with the third material layers 131. The third material layers 131 may be a metal having a lower resistance than poly silicon. For example, the third material layers 131 may be tungsten.

In another embodiment, the first material layers 111 are made of the interlayer insulating layers and the second material layers 113 are made of the conductive material for conductive pattern usage. In this embodiment, the second material layers 113 may not be replaced with the third material layers 131.

When the first material layers 111 are made of the sacrificial conductive material and the second material layers 113 are made of the conductive material for conductive pattern usage, the first material layers 111 may be replaced with an insulating material through the second slit SI2.

As aforementioned, a gate stacked body GST including a structure where the interlayer insulating layers and the conductive patterns are stacked alternately is formed using various methods. The gate stacked body GST includes the first upper stacked body STb1, the second upper stacked body STb2 and the lower stacked body STa. Each of the first upper stacked body STb1 and the second upper stacked body STb2 may include at least one of the first material layers 111, which are divided by the first slit (SI1 of FIG. 5A) and second slits SI2, and at least one of the third material layers 131, which are divided by the first slit (SI1 of FIG. 5A) and the second slits SI2.

The lower stacked body STa may include the first material layers 111 and the third material layers 131 being divided by the second slits SI2, and arranged alternately below the first upper stacked body STb1 and the second upper stacked body STb2. The lower stacked body STa may be penetrated by the dummy holes DH, and the dummy holes DH may be arranged within the lower stacked body STa such that they are spaced apart from each other.

The first upper stacked body STb1 surrounds the first to $N^{th}$ channel pillars CPL1 to CPLn of the first pillar group GR1 illustrated in FIG. 5A, and surrounds the first to $N^{th}$ channel pillars CPL1 to CPLn of the second pillar group GR2 illustrated in FIG. 5A. The lower stacked body STa surrounds the first to $N^{th}$ channel pillars CPL1 to CPLn of the first pillar group GR1 and the second pillar group GR2 illustrated in FIG. 5A. The first upper stacked body STb1 and the second upper stacked body STb2 neighbor each other in the first direction I.

After the second slit SI2 is formed, the side wall insulating layer 133 is formed on the side wall of the second slit SI2. The side wall insulating layer 133 may include at least one of an oxide layer and a nitride layer.

Figure 7:
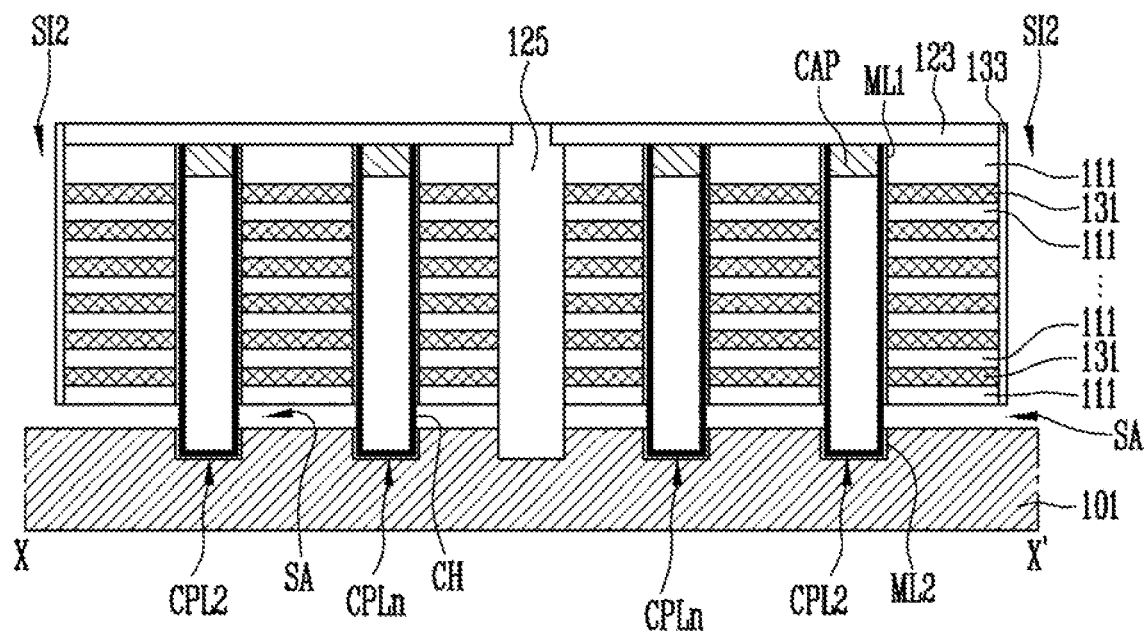

FIG. 7 is a cross-sectional view illustrating a process of opening the source area. FIG. 7 is a cross-sectional view taken along the line X-X' illustrated in FIG. 5A. Referring to FIG. 7, the sacrifice layer (105 of FIG. 6) is removed with the stacked structure of the first material layers 111 and the third material layers 131 being protected by the side wall insulating layer 133. Thus, a portion of the memory layer (ML of FIG. 7) surrounding each of the first to $N^{th}$ channel pillars CPL1 to CPLn may be exposed.

Thereafter, the exposed area of the memory layer (ML of FIG. 6) is removed to expose a portion of the channel layer CH of each of the first to $N^{th}$ channel pillars CPL1 to CPLn.

In the process of the removing the memory layer ML, a portion of the side wall insulating layer 133 and the protection layer (103 of FIG. 6) may be removed. The area from which the memory layer (ML of FIG. 6) and the sacrifice layer (105 of FIG. 6) are removed may be defined as the source area SA. By the source area SA, the memory layer may be divided into a first memory pattern ML1 and a second memory pattern ML2.

Figure 8:
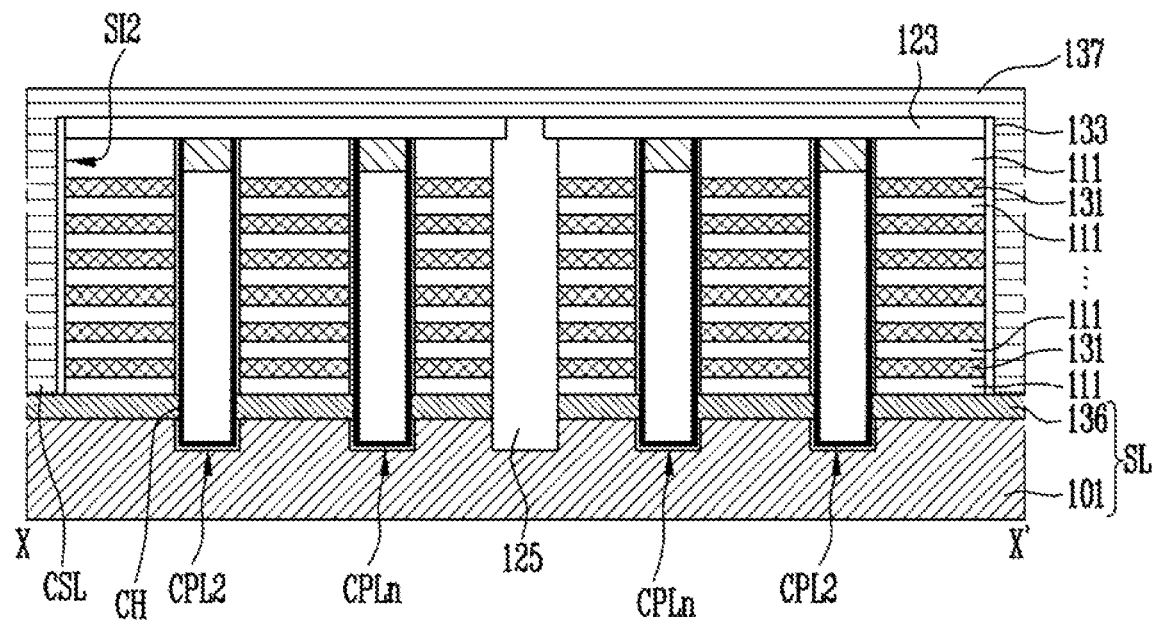

FIG. 8 is a cross-section view illustrating a process of forming a second source layer. FIG. 8 is a cross-sectional view taken along the line X-X' illustrated in FIG. 5A. Referring to FIG. 8, the source area SA may be filled with the second source layer 136. Thus, a source line SL of a stacked structure of the first source layer 101 and the second source layer 136 may be formed. The second source layer 136 contacts the first source layer 101 and the channel layer CH, and is electrically connected to the first source layer 101 and the channel layer CH.

The second source layer 136 may be formed by growing an epi-layer from the first source layer 101 and the channel layer CH by a selective epitaxial growth (SEG) method. In another embodiment, the second source layer 136 may be formed by filling the source area SA with a conductive material for source usage. The second source layer 136 may be made of poly silicon. Thereafter, impurities may be doped on the second source layer 136.

Next, the second slit SI2 is filled with a conductive material for common source line usage 137. The conductive material for common source line usage 137 may include a barrier metal layer and a metal layer. The barrier metal layer may be formed in a dual-layered structure of a titanium layer and a titanium nitride layer. The metal layer may include tungsten.

Figure 9:
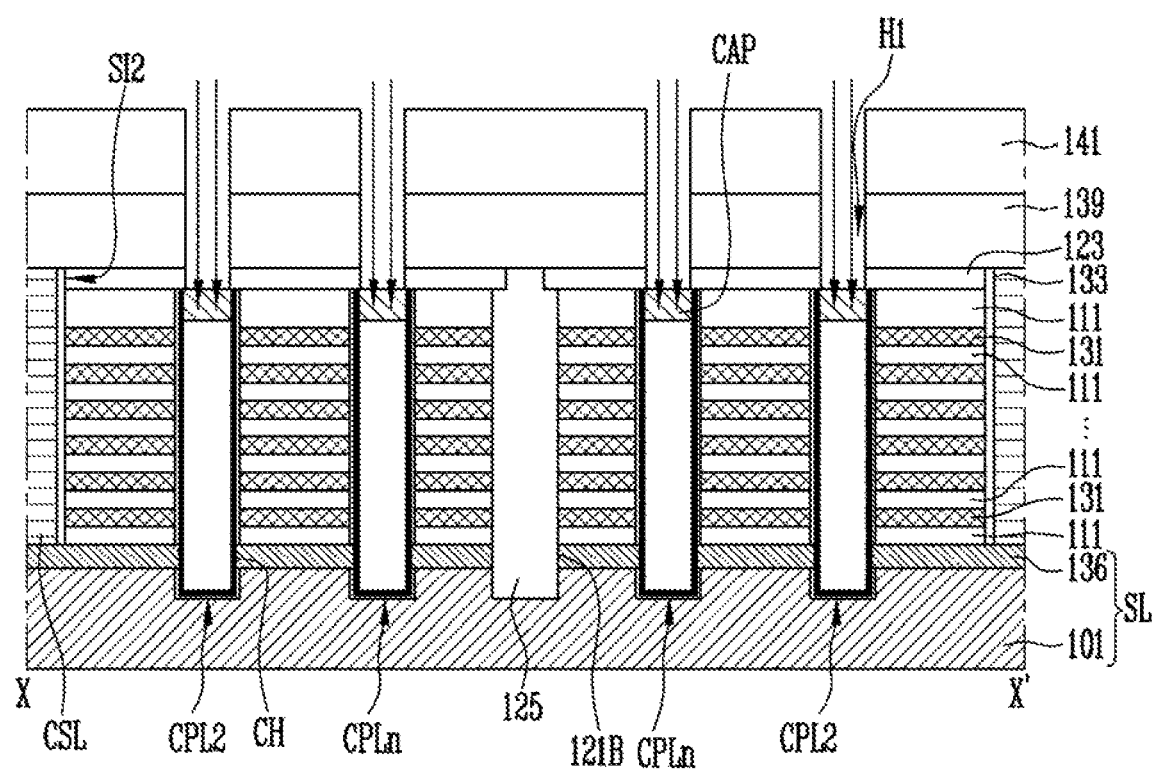

FIG. 9 is a cross-sectional view illustrating a process of forming the common source line and a process of doping the capping conductive layer. FIG. 9 is a cross-sectional view taken along the line X-X' illustrated in FIG. 5A. Referring to FIG. 9, the surface of the conductive material for common source line usage 137 is planarized until the first upper insulating layer 123 is exposed. By this, the common source line CSL may remain only inside the second slit SI2.

Thereafter, the second upper insulating layer 139 may be formed on the first upper insulating layer 123 such that it covers the common source line CSL. Next, a mask pattern 141 is formed on the second upper insulating layer 139. The mask pattern 141 includes openings that expose the capping conductive layer CAP of each of the first to $N^{th}$ channel pillars CPL1 to CPLn. The second upper insulating layer 139 and the first upper insulating layer 123 are etched through the openings of the mask pattern 141 to form first holes H1 that penetrate the second upper insulating layer 139 and the first upper insulating layer 123.

Thereafter, impurities may be doped through the first holes H1, thereby increasing the doping concentration of impurities of the capping conductive layer CAP. The mask pattern 141 may be removed after doping the impurities.

Figure 10A:
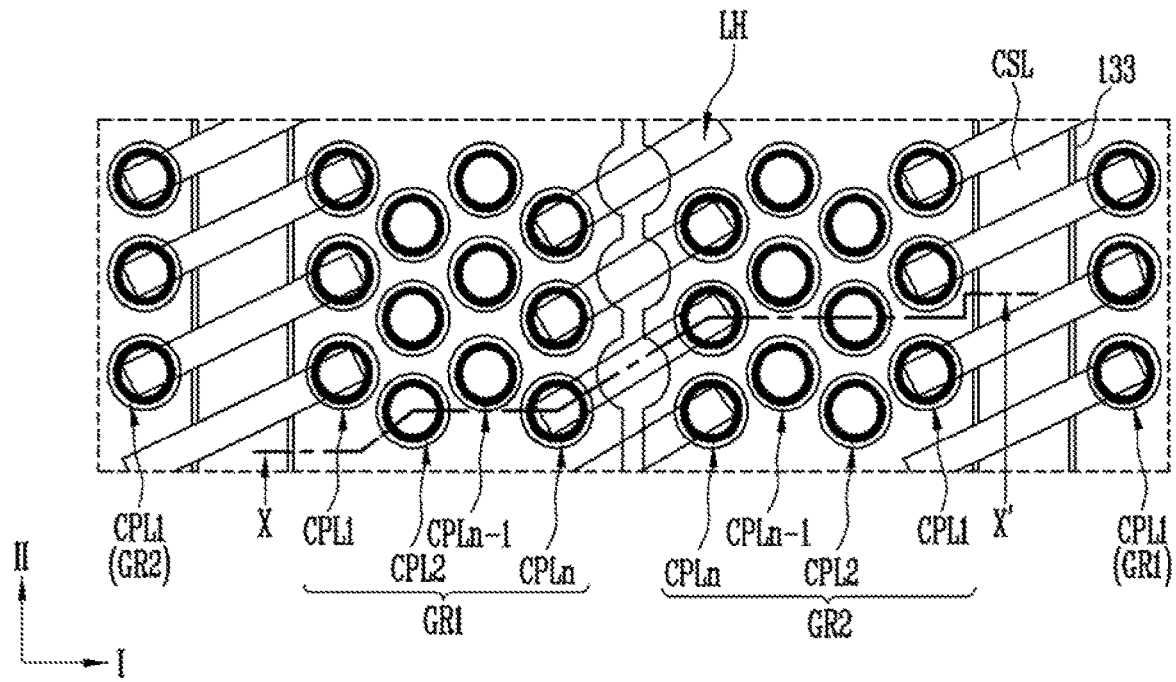
Figure 10B:
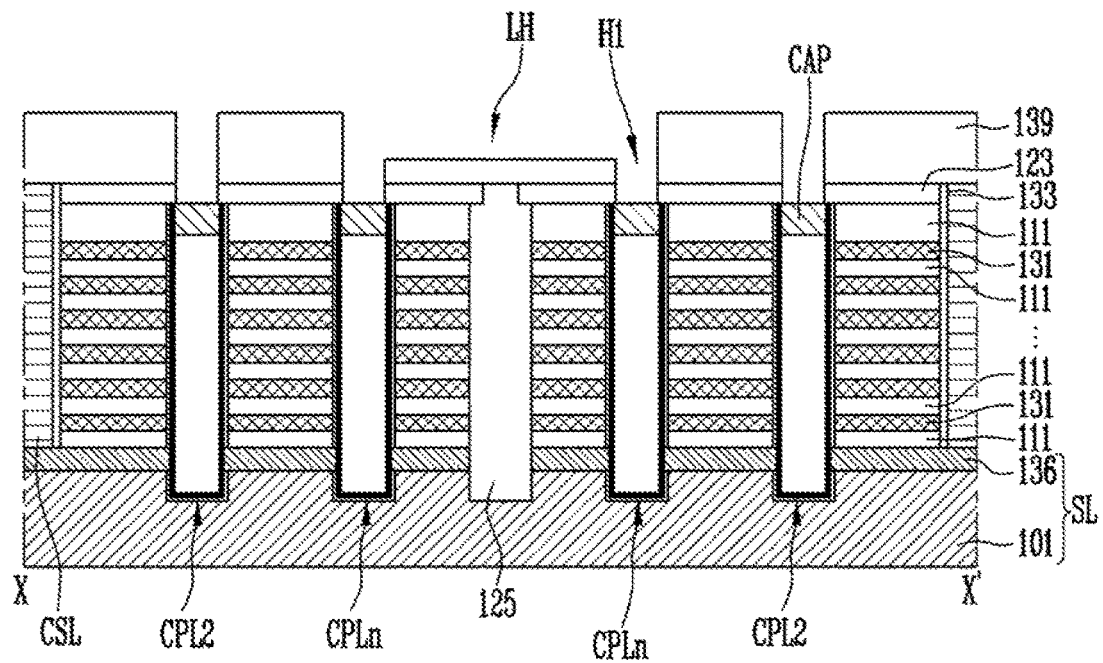

FIG. 10A and FIG. 10B are a plane view and a cross-sectional view illustrating a process of forming line grooves. FIG. 10B is a cross-sectional view taken along the line X-X' illustrated in FIG. 10A. Referring to FIG. 10A and FIG. 10B, the second upper insulating layer 139 is etched to form the line grooves LH. The line grooves LH are connected to the first holes H1 exposing the first and $N^{th}$ channel pillars CPL1 to CPLn, and extend along the direction intersecting the first direction I.

For example, the line grooves LH may be formed in bar shapes extending in a diagonal direction with respect to the first direction I. Each of the line grooves LH1 may expose one pair of the $N^{th}$ channel pillars CPLn of the first pillar group GR1 and the $N^{th}$ channel pillar CPLn of the second pillar group GR2 neighboring each other in the diagonal direction with respect to the first direction I and the second direction II.

Figure 11:
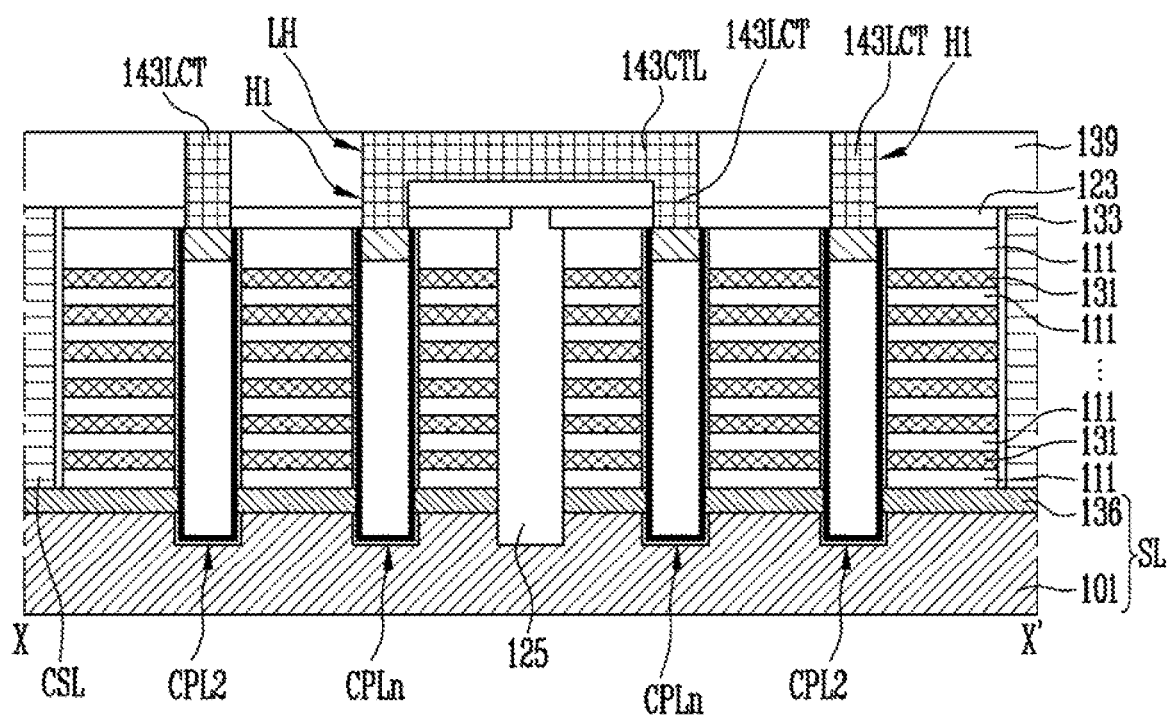

FIG. 11 is a cross-sectional view illustrating a process of forming the contact lines and the lower contact plugs. FIG. 11 is a cross-sectional view taken along the line X-X' illustrated in FIG. 10A. Referring to FIG. 11, the inside of the line grooves LH and the first holes H1 are filled with a conductive material. The surface of the conductive material may be planarized until the second upper insulating layer 139 is exposed. By this, lower contact plugs 143LCT arranged inside the first holes H1 and contact lines 143CTL arranged inside the line grooves LH are formed. The lower contact plugs 143LCT connected to the first channel pillars of the first pillar group and the second pillar group (CPL1 of GR1 and GR2 illustrated in FIG. 5A) are connected to their respective contact line 143CTL, in pairs. The lower contact plugs 143LCT connected to the $N^{th}$ channel pillars of the first pillar group and the second pillar group (CPLn of GR1 and GR2 illustrated in FIG. 5A) are connected to their respective contact line 143CTL, in pairs.

The lower contact plugs 143LCT and the contact lines 143CTL may include a metal layer surrounded by a barrier metal layer. The barrier metal layer may include a titanium layer and a titanium nitride layer, and the metal layer may include tungsten having a lower resistance than silicon.

Figure 12A:
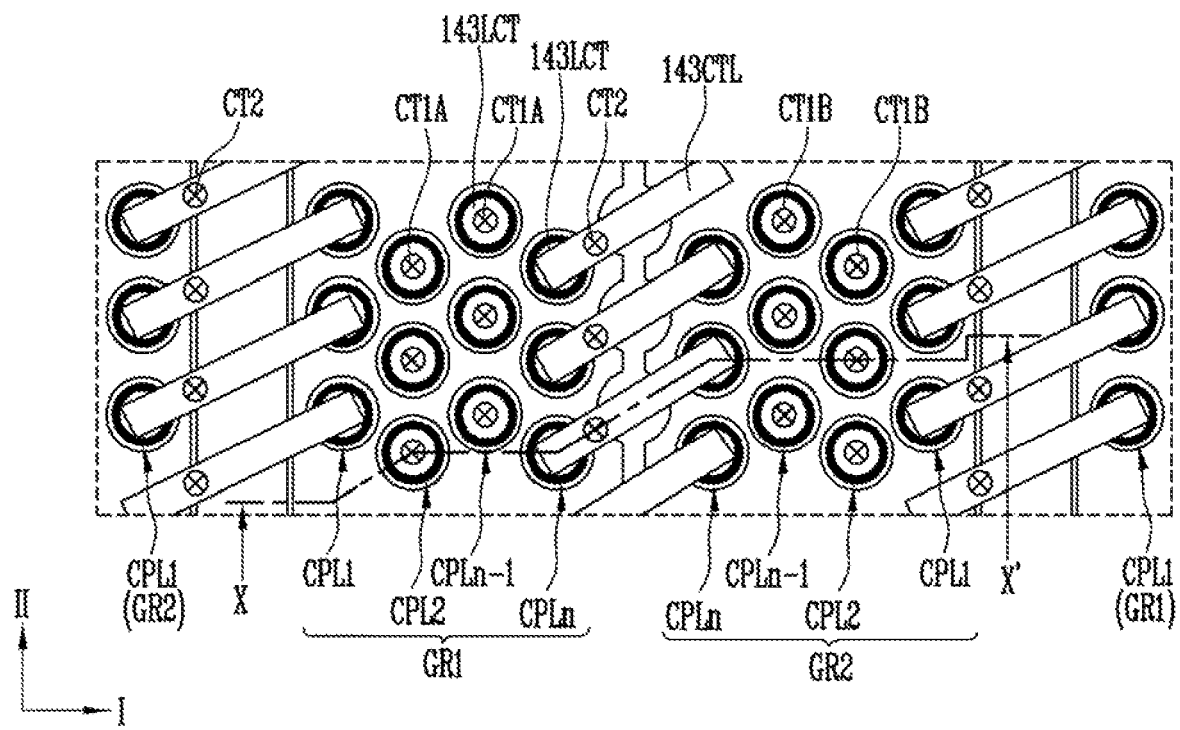
Figure 12B:
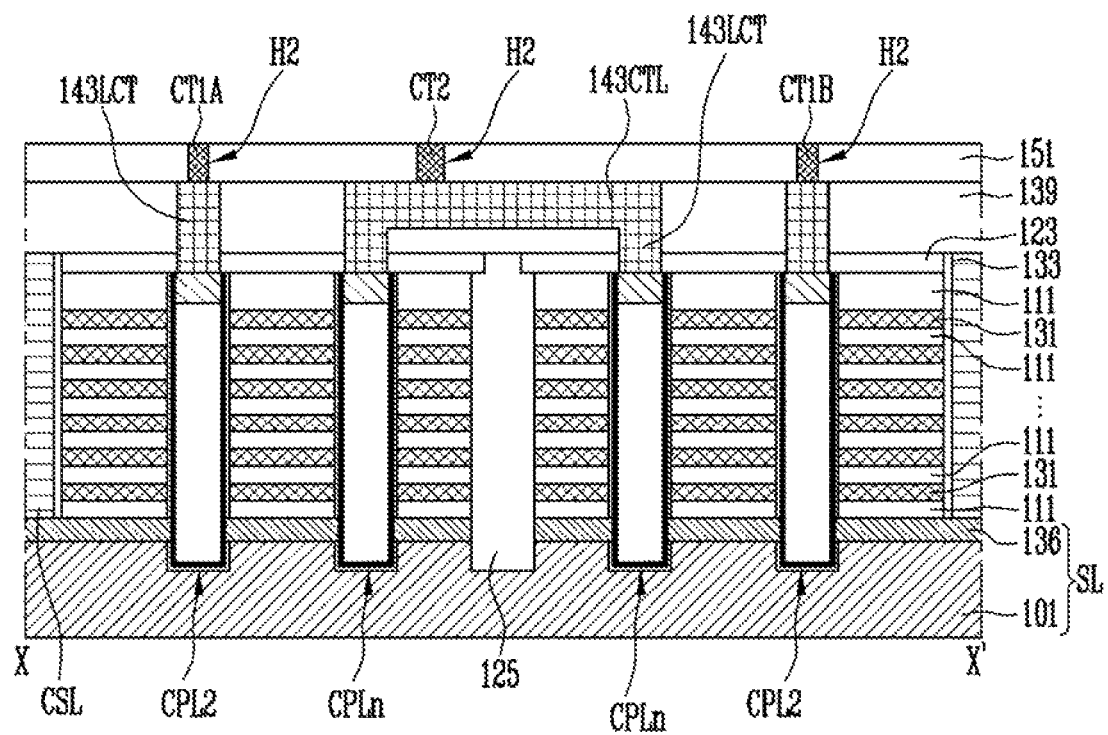

FIG. 12A and FIG. 12B are a plane view and a cross-sectional view illustrating a process of forming the first to second contact plugs. FIG. 12B is a cross-sectional view. taken along the line X-X' illustrated in FIG. 12A. Referring to FIG. 12A and FIG. 12B, the third upper insulating layer 151 is formed on the second upper insulating layer 139 such that it covers the lower contact plugs 143LCT and the contact lines 143CTL.

Thereafter, second holes H2 that penetrate the third upper insulating layer 151 are formed. The second holes H2 may expose the contact lines 143CTL or expose the lower contact plugs 143LCT contacting the second to N-$1^{th}$ channel pillars CPL2 to CPLn-1.

Next, the second holes H2 are filled with a conductive material, and the surface of the conductive material is planarized until the third upper insulating layer 151 is exposed. Thus, the first and second contact plugs CT1A and CT1B and the third contact plugs CT2 are formed inside the second holes H2. The second axis extending in the first direction I and across the center each of the first and second contact plugs CT1A and CT1B does not coincide with the first axis extending in the first direction I and across the center of the third contact plugs CT2.

Figure 13A:
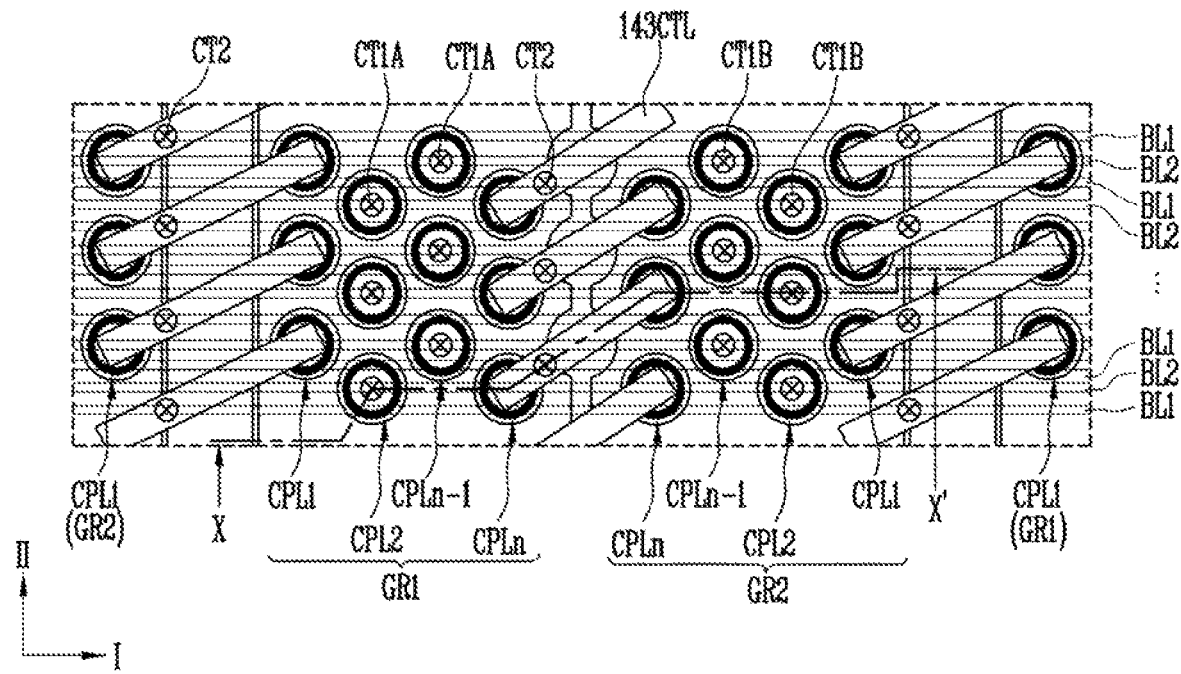
Figure 13B:
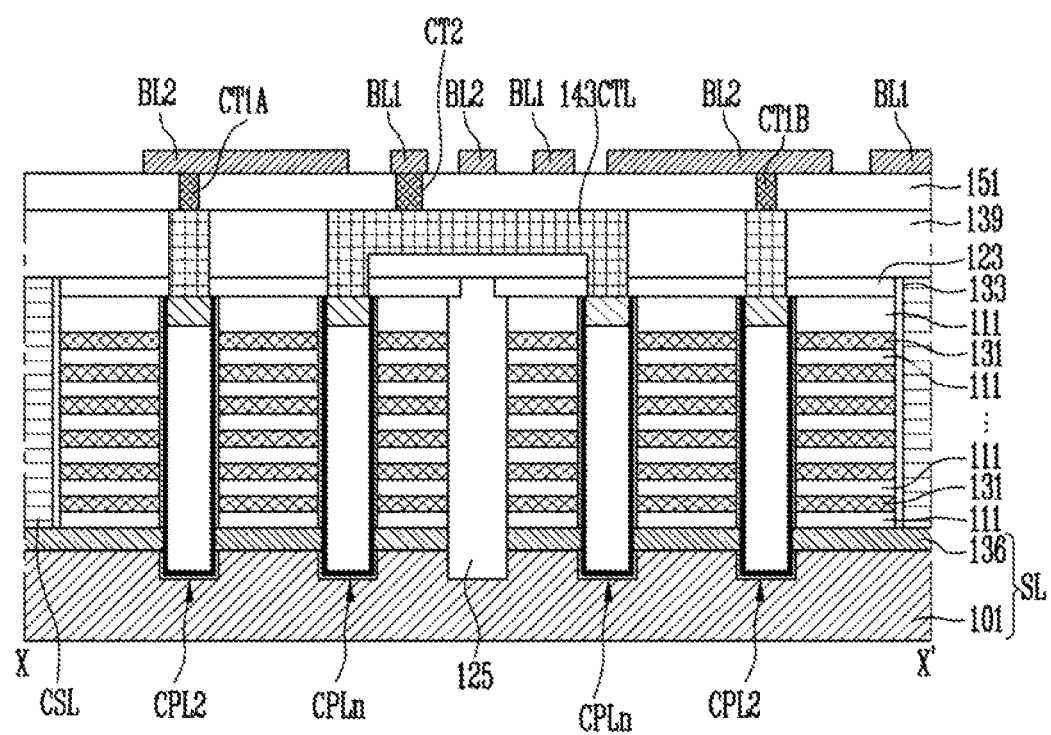

FIG. 13A and FIG. 13B are a plane view and a cross-sectional view illustrating a process of forming the bit lines. FIG. 13B is a cross-sectional view taken along the line X-X' illustrated in FIG. 13A. Referring to FIG. 13A and FIG. 13B, a conductive layer is laminated and then patterned to form the first bit lines BL1 connected to the third contact plugs CT2 and the second bit lines BL2 connected to the first and second contact plugs CT1A and CT1B. The first bit lines BL1 and the second bit lines BL2 are arranged alternately along the second direction II.

The first bit lines BL1 and the second bit lines BL2 may include copper. Each of the second bit lines BL2 may connect the first and second contact plugs CT1A and CT1B in pairs. The first contact plugs CT1A of the first plug group are those arranged on top of the first upper stacked body, and the second contact plugs CT1B of the second plug group are those arranged on top of the second upper stacked body.

Figure 14:
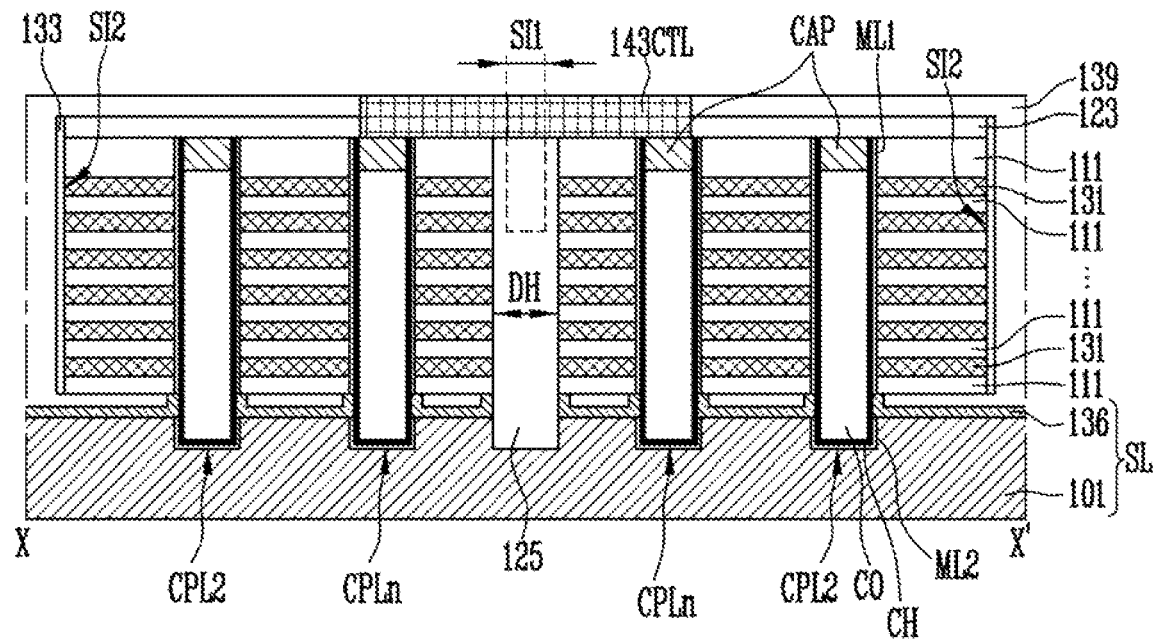
FIG. 14 to FIG. 16 are views illustrating a manufacturing method for a semiconductor device illustrated in FIG. 3B.
Figure 15:
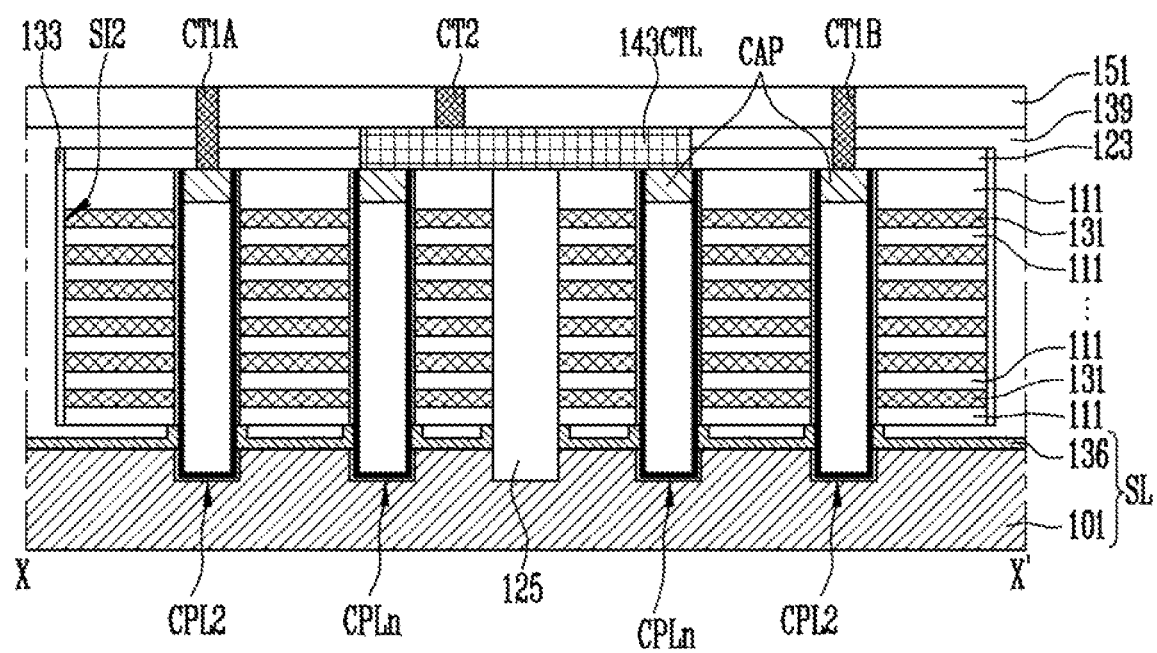
Figure 16:
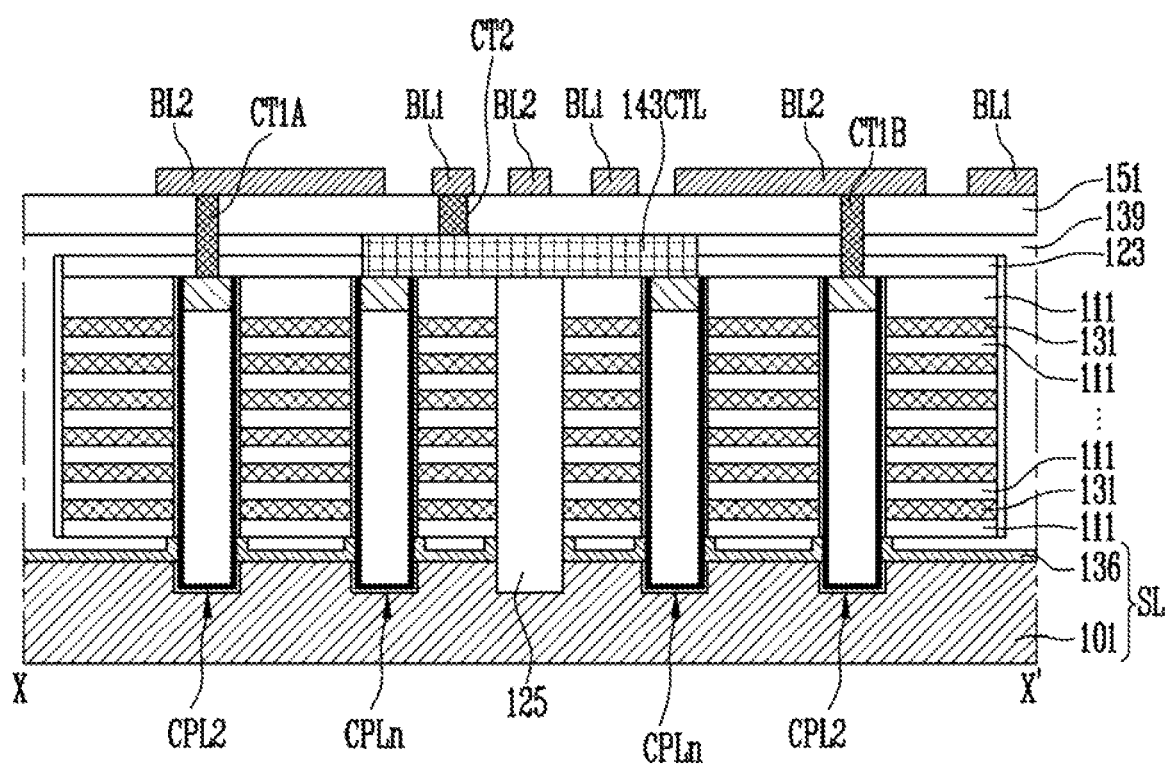

FIG. 14 to FIG. 16 are views illustrating a method for manufacturing the semiconductor device illustrated in FIG. 3B. FIG. 14 to FIG. 16 are cross-sectional views taken along the line X-X' illustrated in FIG. 2. FIG. 14 is a cross-sectional view illustrating a process for forming the second source layer and a process for forming the contact line.

Referring to FIG. 14, the first source layer 101, the first to $N^{th}$ channel pillars (CPL1 to CPLn of FIG. 2), the dummy hole DH, the first slit SI1, the first upper insulating layer 123, the insulating material 125 and the second slits SI2 are formed using the processes aforementioned with reference to FIG. 4A to FIG. 6. Each of the first to $N^{th}$ channel pillars (CPL1 to CPLn of FIG. 2) may include the channel layer CH surrounding the core insulating layer CO and the capping conductive layer CAP. The first material layers 111 and the third material layers 131 which are stacked alternately may be divided into the gate stacked bodies GST as described with reference to FIG. 6.

Thereafter, the side wall insulating layer 133 is formed on the side wall of the second slit SI2. The side wall insulating layer 133 may be formed as a single oxide layer. Each of the first material layers 111 may be made of an interlayer insulating layer, and each of the third material layers 131 may be made of a conductive material.

Thereafter, a portion of the sacrifice layer and the memory layer is removed to open the source area as described with reference to FIG. 7. The memory layer may be divided into the first memory pattern ML1 and the second memory pattern ML2 by the source area.

Next, the second source layer 136 may be formed by the selective epitaxial growth (SEG) method from the channel layer CH and the first source layer 101 exposed through the source area. Thus, the source line SL of a stacked structure of the first source layer 101 and the second source layer 136 may be formed. The second source layer 136 contacts the first source layer 101 and the channel layer CH to be electrically connected thereto. The second source layer 136 may be made of poly silicon. When the growth thickness of the second source layer 136 is controlled to be thin, the second source layer 136 may be formed along the shape of the surface of the source area. Accordingly, a groove may be defined on the surface of the second source layer 136.

Thereafter, the slit insulating layer 139 may be formed on the first upper insulating layer 123. The slit insulating layer 139 may be formed to fill the groove of the second source layer 136 and the second slits SI2.

Next, the process of etching the slit insulating layer 139 and the first upper insulating layer 123 to form the line grooves having the layout aforementioned with reference to FIG. 10A, the process of filling the line grooves with the conductive material, and the process of planarizing the surface of the conductive material until the slit insulating layer 139 is exposed, are performed sequentially. Thus, the contact lines 143CTL directly contacting the upper surface of the first channel pillars (CPL1 of FIG. 2) and the $N^{th}$ channel pillars CPLn are formed. Each of the contact lines 143CTL may contact the upper surface of the capping conductive layer CAP.

FIG. 15 illustrates a plane view and a cross-sectional view provided to describe the process of forming the first to third contact plugs. Referring to FIG. 15, the second upper insulating layer 151 is formed on the slit insulating layer 139 such that it covers the contact lines 143CTL.

Thereafter, the process of forming the second holes that penetrate at least one of the first upper insulating layer 123, the slit insulating layer 139 and the second upper insulating layer 151 to expose the contact lines 143CTL and the second to N-1$^{th}$ channel pillars (CPL2 to CPLn-1 illustrated in FIG. 2), the process of filling the second holes with the conductive material, and the process of planarizing the surface of the conductive material until the second upper insulating layer 151 is exposed, are performed sequentially. Accordingly, the first and second contact plugs CT1A and CT1B contacting the second to N-1$^{th}$ channel pillars (CPL2 to CPLn-1 illustrated in FIG. 2) and the third contact plugs CT2 contacting the contact lines 143CTL are formed. The arrangement of the first contact plugs CT1A, the second contact plugs CT1B and the third contact plugs CT2 is the same as that aforementioned with reference to FIG. 2, FIG. 12A and FIG. 12B.

FIG. 16 is a cross-sectional view provided to describe the process of forming the bit lines. Referring to FIG. 16, a conductive layer is laminated and then patterned to form the second bit lines BL2 connected to the first and second contact plugs CT1A and CT1B, and the first bit lines BL1 connected to the third contact plugs CT2. The first bit lines BL1 and the second bit lines BL2 may be arranged in the same layout as that illustrated in FIG. 13A.

Figure 17:
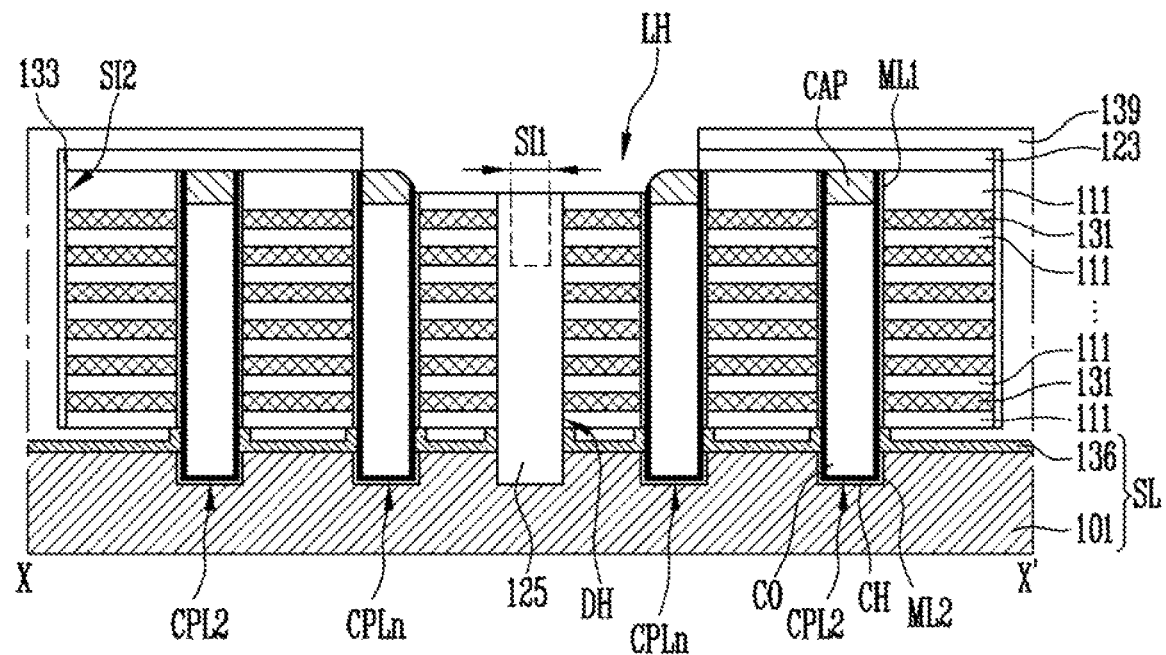
FIG. 17 and FIG. 18 are views illustrating a manufacturing method for a semiconductor device illustrated in FIG. 3C.
Figure 18:
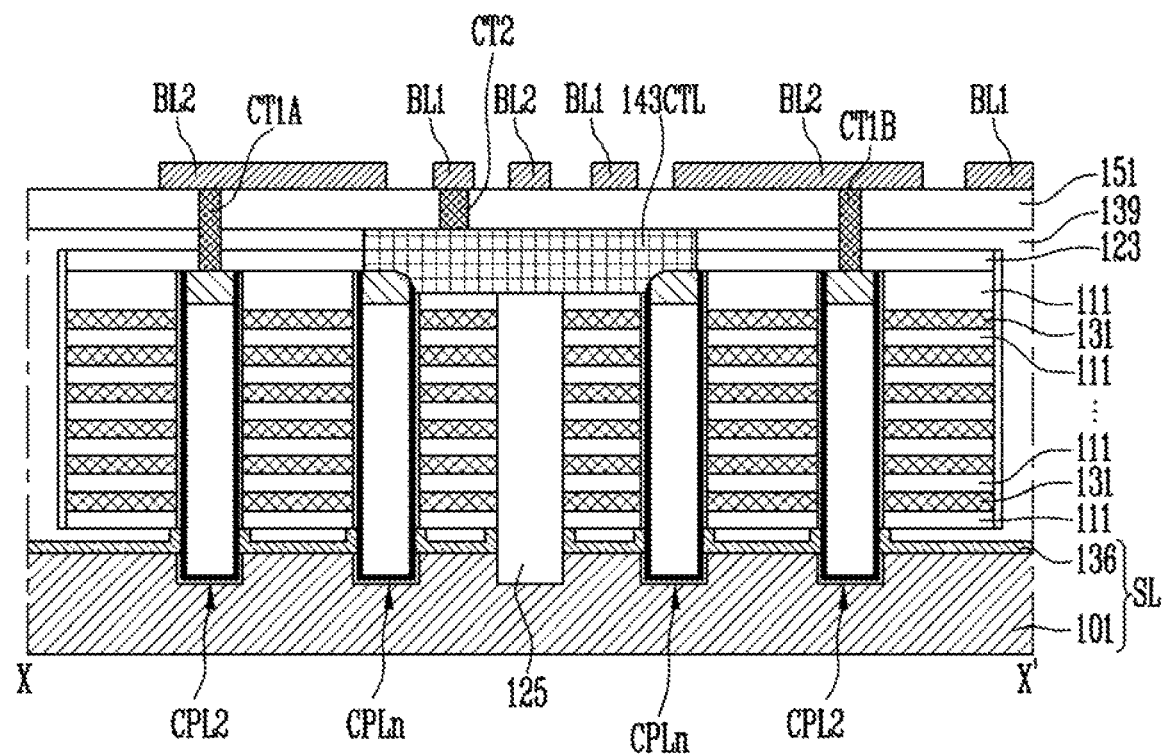
Figure 19:
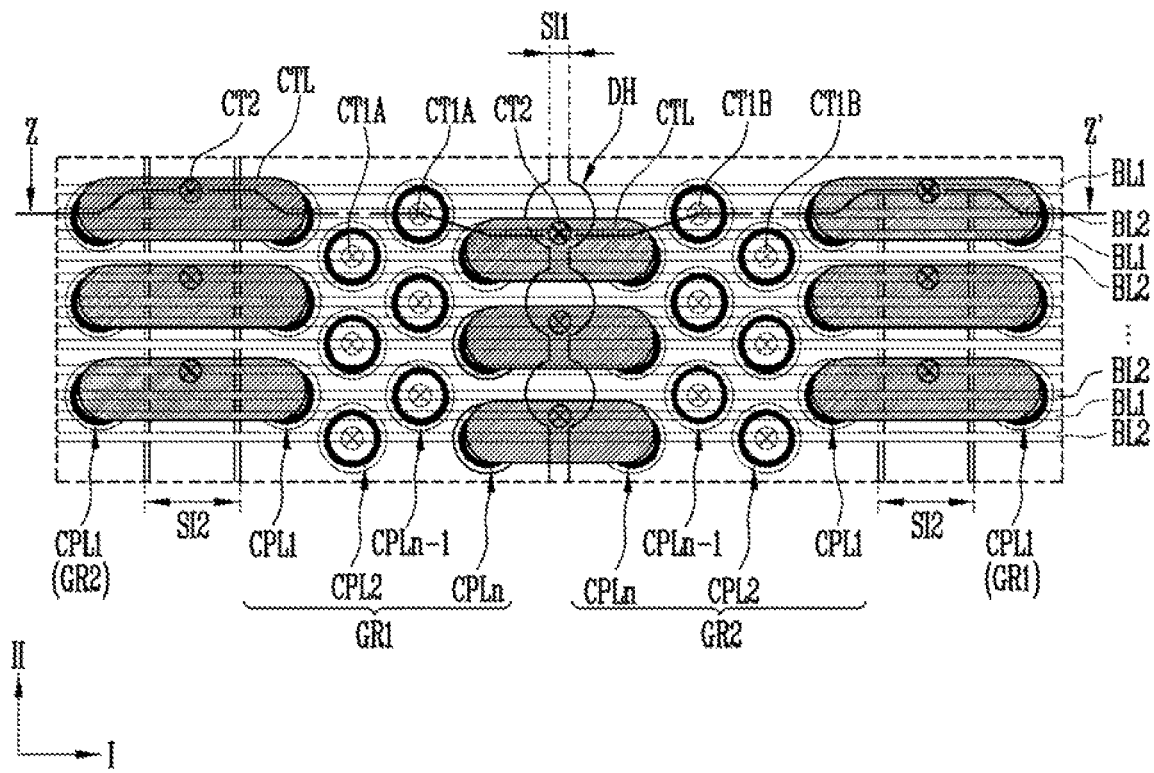
FIG. 19 is a view of a layout illustrating a connection relationship between channel pillars and bit lines according to an embodiment of the present disclosure.

FIG. 17 and FIG. 18 are views provided to describe an example of the method for manufacturing the semiconductor device illustrated in FIG. 3C. FIG. 17 and FIG. 19 are cross-sectional views taken along the same direction as the line X-X' illustrated in FIG. 2. FIG. 17 is a cross-sectional view provided to describe the process of forming the line groove.

Referring to FIG. 17, the first source layer 101, the first to N$^{th}$ channel pillars (CPL1 to CPLn of FIG. 2), the dummy hole DH, the first slit SI1, the first upper insulating layer 123, the insulating material 125 and the second slits SI2 are formed using the processes aforementioned with reference to FIG. 4A to FIG. 6. The first material layers 111 and the third material layers 131 stacked alternately may be divided into the gate stacked bodies GST by the first slit SI1 and the second slits SI2 as aforementioned with reference to FIG. 6. Each of the first to N$^{th}$ channel pillars (CPL1 to CPLn of FIG. 2) may include the channel layer CH surrounding the core insulating layer CO and the capping conductive layer CAP.

Thereafter, the side wall insulating layer 133, the second source layer 136 that divides the first memory pattern ML1 and the second memory pattern ML2, and the slit insulating layer 139 are formed using the aforementioned processes with reference to FIG. 14A. The stacked structure of the first source layer 101 and the second source layer 136 may constitute the source line SL. The second source layer 136 may contact the channel layer CH between the first memory pattern ML1 and the second memory pattern ML2.

Next, the slit insulating layer 139 and the first upper insulating layer 123 are etched to form the line grooves LH having the layout aforementioned with reference to FIG. 10A. Here, a portion of the uppermost first material layer 111 constituting the first and second upper stacked bodies is etched. In this case, a portion of the first memory pattern ML1 and a portion of the insulating material 125 may be etched.

Depths of the line grooves LH formed by the aforementioned etching process may be controlled such that they expose the side walls of the first channel pillars (CPL1 of FIG. 2) and the side walls of the N$^{th}$ channel pillars CPLn. The depth of each line groove LH may be controlled such that it exposes the side wall of the capping conductive layer CAP and the side wall of the channel layer CH. Each of the line grooves LH is formed in a bar shape extending diagonally with respect to the first direction I as illustrated in FIG. 10A.

Referring to FIG. 18, the contact lines 143CTL are formed inside the line grooves LH illustrated in FIG. 17. The contact lines 143CTL may be formed using the processes aforementioned with reference to FIG. 14. Some of the contact lines 143CTL extend from the N$^{th}$ channel pillar of the first pillar group (CPLn of GR1 illustrated in FIG. 2) towards the N$^{th}$ channel pillar of the second pillar group (CPLn of GR2 illustrated in FIG. 2), and contact the side walls of the N$^{th}$ channel pillars CPLn of the first and second pillar group. The other contact lines 143CTL extend from the first channel pillar of the first pillar group (CPL1 of GR1 illustrated in FIG. 2) towards the first channel pillar of the second pillar group (CPL1 of GR2 illustrated in FIG. 2), and contact the side walls of the first channel pillars of the first and second pillar group (CPL1 of GR1 and GR2 illustrated in FIG. 2).

After the contact lines 143CTL are formed, the second upper insulating layer 151, the first contact plugs CT1A of the first plug group, the second contact plugs CT1B of the second plug group, and the third contact plugs CT2 are formed by performing the same processes as those aforementioned with reference to FIG. 15. The arrangement of the first contact plugs CT1A of the first plug group, the second contact plugs CT1B of the second plug group, and the third contact plugs CT2 is the same as that aforementioned with reference to FIG. 2, FIG. 12A and FIG. 12B.

Next, the first and second bit lines BL1, BL2 are formed by performing the same processes as those aforementioned with reference to FIG. 16. The first bit lines BL1 and the second bit lines BL2 are arranged in the same layout as that aforementioned with reference to FIG. 13A.

FIG. 19 is a view of a layout provided to describe a connection relationship between the channel pillars and the bit lines according to an embodiment of the present disclosure. More specifically, FIG. 19 exemplifies the contact lines that are arranged in a layout different from the layout of the contact lines illustrated in FIG. 2.

Referring to FIG. 19, each of the contact lines CTL may be formed in a straight line bar shape extending such that it perpendicularly intersects the second direction II. Otherwise, each of the contact lines CTL has a straight line bar shape extending in the first direction I. The second direction II is the extending direction of the first and second slits SI1, SI2. The first direction I is the extending direction of the first and second bit lines BL1, BL2, which perpendicularly intersects the second direction II. Some of the contact lines CTL intersect the first slit SI1, and the other contact lines CTL intersect the second slits SI2.

The first slit SI1 is arranged between the second slits SI2 neighboring each other in the first direction I. The dummy holes DH are arranged along the extending direction of the first slit SI1. The central axis of the dummy holes DH overlaps the first slit SI1. The dummy holes DH1 are formed deeper than the first slit SI1. For example, the dummy holes DH are formed deeper than the first to N$^{th}$ channel pillars CPL1 to CPLn of the first pillar group GR1 and the second pillar group GR2. The second slits SI2 are formed deeper than the first slit SI1.

Some of the contact lines CTL connect the first channel pillar CPL1 of the first pillar group GR1 and the first channel pillar CPL1 of the second pillar group GR2 neighboring each other in the first direction I having each second slit SI2 therebetween, in pairs. The others of the contact lines CTL connect the N$^{th}$ channel pillar CPLn of the first pillar group GR1 and the N$^{th}$ channel pillar CPLn of the second pillar group GR2 neighboring each other in the first direction I having the first slit SI1 therebetween, in pairs.

The second to N−1$^{th}$ channel pillars CPL2 to CPLn-1 of the first pillar group GR1 are arranged in the first direction I between the first channel pillar CPL1 of the first pillar group GR1 and the N$^{th}$ channel pillar CPLn of the first pillar group GR1. The second to N−1$^{th}$ channel pillars CPL2 to CPLn-1 of the second pillar group GR2 are arranged in the first direction I between the first channel pillar CPL1 of the second pillar group GR2 and the N$^{th}$ channel pillar CPLn of the second pillar group GR2. The first to N$^{th}$ channel pillars CPL1 to CPLn-1 of each of the first pillar group GR1 and the second pillar group GR2 are arranged in zig-zag form in the first direction I for improved arrangement density.

The second to N−1$^{th}$ channel pillars CPL2 to CPLn-1 of the first pillar group GR1 are connected to the first contact plugs CT1A of the first plug group, and the second to N−1$^{th}$ channel pillars CPL2 to CPLn-1 of the second pillar group GR2 are each connected to the second contact plugs CT1B of the second plug group. The first contact plugs CT1A of the first plug group and the second contact plugs CT1B of the second plug group are arranged in zig-zag form in the first direction I along the arrangement of the second to N−1$^{th}$ channel pillars CPL2 to CPLn-1 of the first pillar group GR1 and the second pillar group GR2. The first and second contact plugs CT1A and CT1B of the first plug group and the second plug group are formed to have narrower diameters than the second to N−1$^{th}$ channel pillars CPL2 to CPLn-1 of the first pillar group GR1 and the second pillar group GR2.

The contact lines CTL are connected to the third contact plugs CT2. To secure the arrangement margin of the third contact plugs CT2, the contact lines CTL may be formed to have broader widths than the first and second bit lines BL1 and BL2.

The second axis extending in the first direction I and across the center of each of the first and second contact plugs CT1A and CT1B does not coincide with the first axis extending in the first direction I and across the center of the third contact plugs CT2.

The first bit lines BL1 and the second bit lines BL2 are arranged alternately along the second direction II. The second bit lines BL2 are connected to the first and second contact plugs CT1A and CT1B, and the first bit lines BL1 are connected to the third contact plugs CT2. Each of the second bit lines BL2 is connected to one of the first contact plugs CT1A and one of the second contact plugs CT1B.

Figure 20:
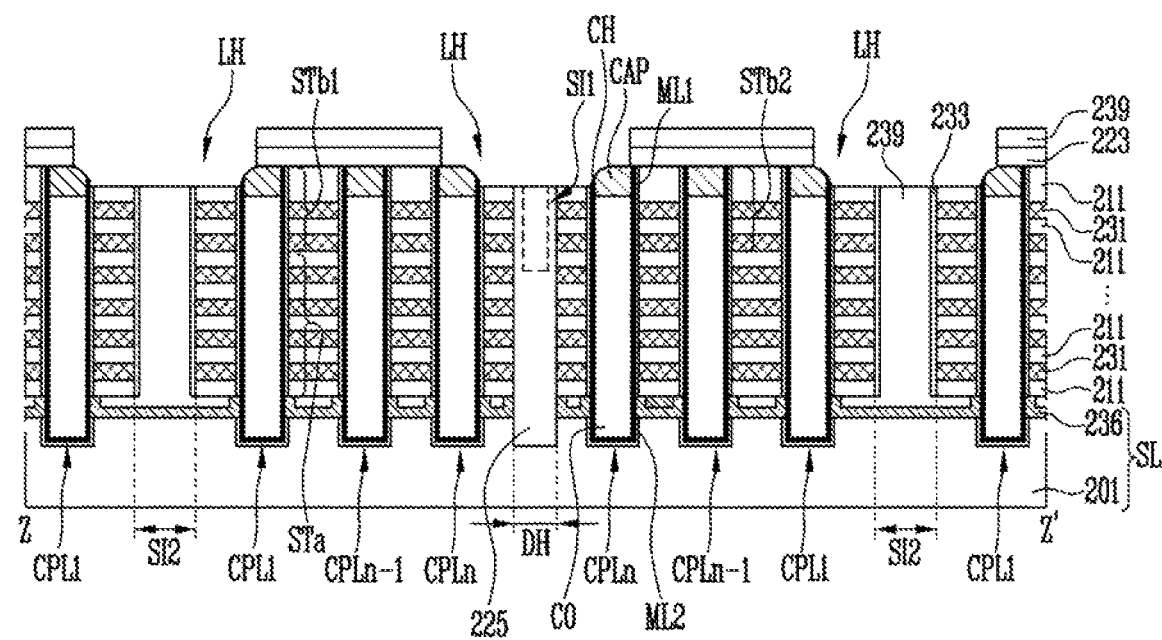
FIG. 20 and FIG. 21 are views illustrating a manufacturing method for a semiconductor device illustrated in FIG. 19.
Figure 21:
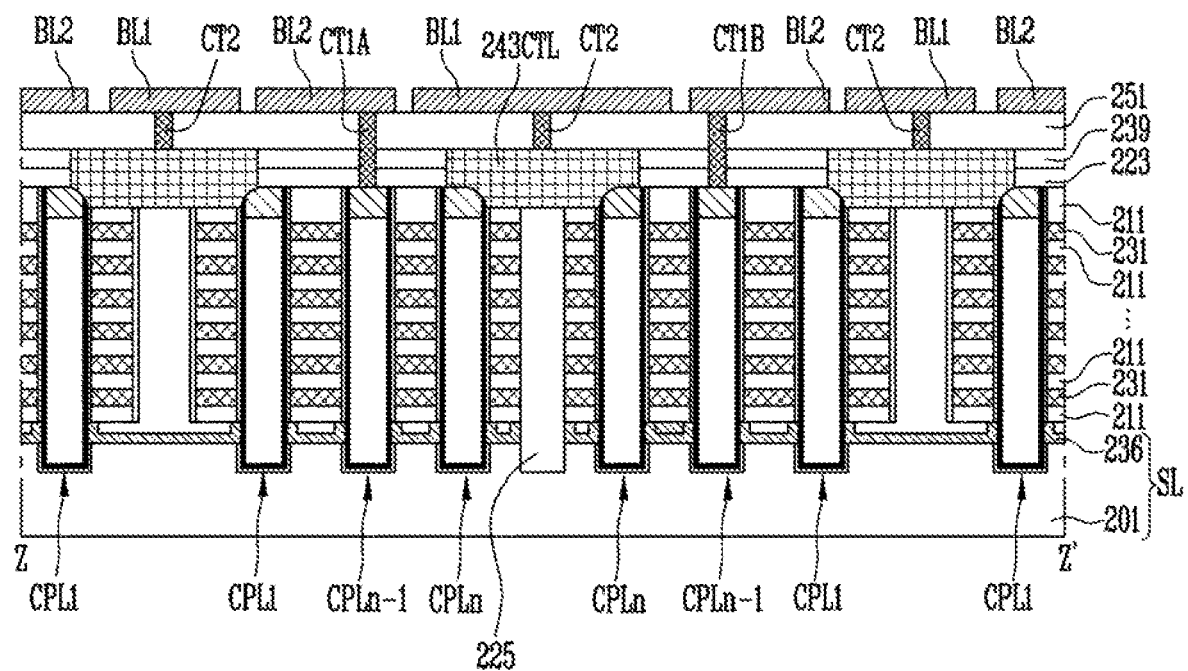

The cross-sectional structure of the semiconductor device having the aforementioned layout is specified in FIG. 20 and FIG. 21. FIG. 20 and FIG. 21 are views provided to describe an example of the method for manufacturing the semiconductor device illustrated in FIG. 19. FIG. 20 and FIG. 21 are cross-sectional views taken along the line Z-Z' illustrated in FIG. 19.

Referring to FIG. 20, the first source layer 201, the first to N$^{th}$ channel pillars CPL1 to CPLn, the dummy hole DH, the first slit SI1, the first upper insulating layer 223, the insulating material 225, and the second slits SI2 are formed using the processes aforementioned with reference to FIG. 4A to FIG. 6. The first to N$^{th}$ channel pillars CPL1 to CPLn are formed in the arrangement aforementioned with reference to FIG. 19. The first to N$^{th}$ channel pillars CPL1 to CPLn may be divided into the first pillar group GR1 and the second pillar group GR2 as aforementioned with reference to FIG. 19. Each of the first to N$^{th}$ channel pillars CPL1 to CPLn may include the core insulating layer CO, the capping conductive layer CAP arranged on an upper portion of the core insulating layer CO and the channel layer CH surrounding the core insulating layer CO and the capping conductive layer CAP. The first material layers 211 and the third material layers 231 stacked alternately may include the first upper stacked body STb1, the second upper stacked body STb2, and the lower stacked body STa as aforementioned with reference to FIG. 6 by the first slit SI1 and the second slits SI2.

Thereafter, the side wall insulating layer 233 is formed on the side wall of the second slit SI2. The side wall insulating layer 233 may be formed as a single oxide layer. Each of the first material layers 211 may be made of an interlayer insulating layer, and each of the third material layers 231 may be made of a conductive material.

Next, after the source area that divides the first memory pattern ML1 and the second memory pattern ML2 is opened in the same process as that aforementioned with reference to FIG. 7, the second source layer 236 may be formed inside the source area. Thus, the source line SL of a stacked structure of the first source layer 201 and the second source layer 236 may be formed. Thereafter, the slit insulating layer 239 is formed on the first upper insulating layer 223. The slit insulating layer 239 may be formed to fill the second slits SI2.

Next, the slit insulating layer 239 and the first upper insulating layer 223 are etched to form the line grooves LH having the same layout as the contact lines CTL illustrated in FIG. 19. During the etching process for forming the line grooves LH, a portion of the uppermost layer first material layer 211 constituting the first and second upper stacked bodies STb1 and STb2, a portion of the insulating material 225 filling the dummy hole DH and the first slit SI1, and a portion of the first memory pattern ML1 are etched. Thus, the side walls of the first channel pillars CPL1 and the side walls of the N$^{th}$ channel pillars CPLn are exposed by the line grooves LH. The depth of each line groove LH may be controlled by the etching process such that it exposes the side wall of the capping conductive layer CAP and the side wall of the channel layer CH.

Referring to FIG. 21, the contact lines 243CTL contacting the side walls of the first channel pillars CPL1 and the side walls of the N$^{th}$ channel pillars CPLn are formed inside the line grooves LH. Each of the contact lines 243CTL contacts the side wall of the capping conductive layer CAP and the side wall of the channel layer CH. The contact lines 243CTL may have the same layout as the contact lines CTL illustrated in FIG. 19.

Next, the second upper insulating layer 251 is formed on the slit insulating layer 239 such that it covers the contact lines 243CTL. Thereafter, the first and second contact plugs CT1A and CT1B and the third contact plugs CT2 are formed using the same processes as those aforementioned with reference to FIG. 15. The arrangement of the first and second contact plugs CT1A and CT1B and the third contact plugs CT2 is the same as that aforementioned with reference to FIG. 19.

Thereafter, the first and second bit lines BL1 and BL2 are formed using the same processes as those aforementioned with reference to FIG. 16. The arrangement of the first and second bit lines BL1 and BL2 is the same as that aforementioned with reference to FIG. 19.

FIG. 4A to FIG. 18, FIG. 20 and FIG. 21 exemplify the method for manufacturing the semiconductor device having the source line structure illustrated in FIG. 1B, but the present invention is not limited thereto. The semiconductor device having the source line structure illustrated in FIG. 1A may be formed using the manufacturing method illustrated in FIG. 4A to FIG. 18, FIG. 20 and FIG. 21.

Figure 22:
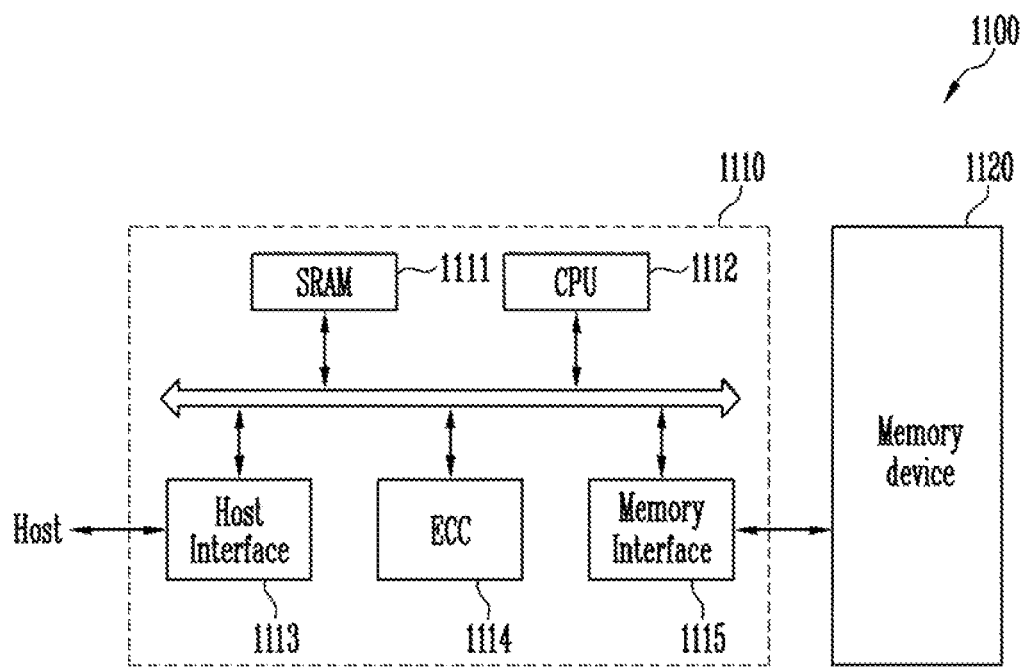
FIG. 22 is a block diagram illustrating a configuration of a memory system according to an embodiment of the present disclosure.

FIG. 22 is a block diagram illustrating a configuration of a memory system according to the embodiment of the present disclosure. Referring to FIG. 22, the memory system 1100 according to the embodiment of the present disclosure includes a memory device 1120 and a memory controller 1110.

The memory device 1120 may include at least one of the structures illustrated in FIG. 2, FIGS. 3A to 3C, FIG. 19 and FIG. 22. For example, the memory device 1120 may include a contact line connecting one pair of channel pillars facing each other with a slit disposed therebetween in a diagonal direction with respect to the slit. In another embodiment, the memory device 1120 may include a contact line connecting one pair of channel pillars facing each other with a slit disposed therebetween, and extending in various directions, the contact line extending deeper than the upper surface of the channel pillars such that the contact line contacts the side walls of the channel pillars.

The memory device 1120 may be a multi-chip package consisting of a plurality of flash memory chips. The memory controller 1110 is configured to control the memory device 1120, and may include a Static Random Access Memory (SRAM) 1111, a CPU 1112, a host interface 1113, an Error Correction Code (ECC) 1114 and a memory interface 1115. The SRAM 1111 is used as the operating memory of the CPU 1112, the CPU 1112 performs the overall control operations for data exchange of the memory controller 1110, and the host interface 1113 is provided with a data exchange protocol of the host accessing the memory system 1100. Further, the ECC 1114 detects and corrects errors included in the data read from the memory device 1120, and the memory interface 1115 performs interfacing with the memory device 1120. Additionally, the memory controller 1110 may further include a Read Only Memory (ROM) and the like for storing code data for interfacing with the host.

The aforementioned memory system 1100 may be a memory card or a Solid State Disk (SSD) formed by combining the memory device 1120 and the controller 1110. For example, in the case where the memory system 1100 is an SSD, the memory controller 1110 may communicate with an external system, for example, a host, through one of the various interface protocols such as Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer Small Interface (SCSI), Enhanced Small Disk Interface (ESDI) and Integrated Drive Electronics (IDE), etc.

Figure 23:
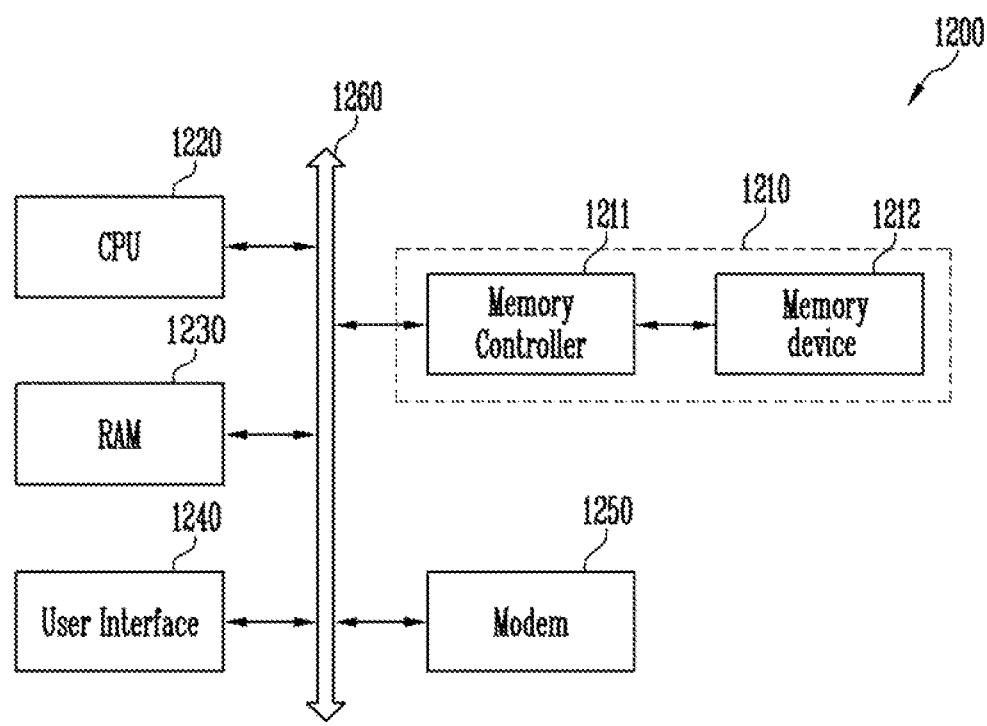
FIG. 23 is a block diagram illustrating a configuration of a computing system according to an embodiment of the present disclosure.

FIG. 23 is a block diagram illustrating a configuration of a computing system according to the embodiment of the present disclosure. Referring to FIG. 23, the computing system 1200 according to an embodiment of the present disclosure may include a CPU 1220, a Random Access Memory (RAM) 1230, a user interface 1240, a modem 1250 and a memory system 1210 electrically connected to a system bus 1260. Further, when the computing system 1200 is a mobile device, the computing system 1200 may further include a battery for supplying an operating voltage to the computing system 1200, an application chip set, a camera image processor (CIS) and a mobile DRAM, etc. The memory system 1210 may consist of the memory device 1212 and the memory controller 1211 as aforementioned with reference to FIG. 22.

According to embodiments, a plurality of channel pillars may penetrate upper stacked bodies. The channel pillars may include a first channel pillar and an $N^{th}$ channel pillar arranged along the boundary of each of the upper stacked bodies, and second to $(N-1)^{th}$ channel pillars interposed between the first and $N^{th}$ channel pillars. The first to $N^{th}$ channel pillars may be electrically connected to bit lines, respectively. According to embodiments, the first and nth channel pillars may be coupled to contact lines. As viewed in the plane, the contact lines may include bit contact areas extending beyond the area where the first to $N^{th}$ channel pillars are arranged. Some of the bit lines may be electrically connected to the first and $N^{th}$ channel pillars in the bit contact areas of the contact lines, and the other bit lines may be coupled to the second to $(N-1)^{th}$ channel pillars in areas where the second to $(N-1)^{th}$ channel pillars are arranged. Therefore, even when the first to $N^{th}$ channel pillars are densely arranged, the pitch of the bit lines may be increased by the bit contact areas of the contact lines. According to embodiments, process defects caused by the reduced pitch between the bit lines may be reduced.

In the drawings and specification, there have been disclosed typical embodiments of the invention, and although specific terms are employed, they are used in a generic and descriptive sense only and not for purposes of limitation. It will be understood by those of ordinary skill in the art that various changes in form and details may be made therein without departing from the spirit and scope of the present invention as defined by the following claims.

What is claimed is:

1. A semiconductor device comprising:
   a first upper stacked body and a second upper stacked body neighboring each other in a first direction, and separated from each other by a slit, wherein the slit extends along a second direction;
   a first pillar group including first to $N^{th}$ channel pillars, wherein the first to $N^{th}$ channel pillars of the first pillar group penetrate the first upper stacked body;
   a second pillar group including first to $N^{th}$ channel pillars, wherein the first to $N^{th}$ channel pillars of the second pillar group penetrate the second upper stacked body;
   a contact line extending from a corner of the $N^{th}$ channel pillar of the first pillar group adjacent to the slit towards a corner of the $N^{th}$ channel pillar of the second pillar group adjacent to the slit; and
   a memory pattern surrounding the $N^{th}$ channel pillar of the first pillar group between the $N^{th}$ channel pillar of the first pillar group and the first upper stacked body,
   wherein the contact line has a first edge overlapped with the $N^{th}$ channel pillar of the first pillar group, a second edge overlapped with the $N^{th}$ channel pillar of the second pillar group, and a center portion extending from the first edge to the second edge,
   wherein the memory pattern has a first part overlapping with the contact line and a second part facing the first to $(N-1)^{th}$ channel pillars of the first pillar group, the first part being shorter than the second part, and
   wherein N is a positive integer.

2. The semiconductor device according to claim 1, wherein the contact line perpendicularly intersects the second direction or extends in a diagonal direction with respect to the first direction and the second direction.

3. A semiconductor device comprising:
   a first upper stacked body and a second upper stacked body neighboring each other in a first direction, and separated from each other by a slit, wherein the slit extends along a second direction;
   a first pillar group including first to $N^{th}$ channel pillars, wherein the first to $N^{th}$ channel pillars of the first pillar group penetrate the first upper stacked body;

a second pillar group including first to $N^{th}$ channel pillars, wherein the first to $N^{th}$ channel pillars of the second pillar group penetrate the second upper stacked body;

a contact line extending from the $N^{th}$ channel pillar of the first pillar group adjacent to the slit towards the $N^{th}$ channel pillar of the second pillar group adjacent to the slit, wherein the contact line extends towards inside of the first upper stacked body and the second upper stacked body, and contacts a side wall of the $N^{th}$ channel pillar of the first pillar group and a side wall of the $N^{th}$ channel pillar of the second pillar group, wherein N is a positive integer;

a first plug group including first contact plugs, wherein the first contact plugs are connected to the second to $(N-1)^{th}$ channel pillars of the first pillar group, respectively, wherein the second to $(N-1)^{th}$ channel pillars the first pillar group are arranged between the first channel pillar of the first pillar group and the $N^{th}$ channel pillar of the first pillar group;

a second plug group including second contact plugs, wherein the second contact plugs are connected to the second to $(N-1)^{th}$ channel pillars of the second pillar group, respectively, wherein the second to $(N-1)^{th}$ channel pillars of the second pillar group are arranged between the first channel pillar of the second pillar group and the $N^{th}$ channel pillar of the second pillar group;

a third contact plug connected to the contact line and formed over the contact line;

a first bit line extending in the fire direction and connected to the third contact plug; and second bit lines connected to the first contact plugs, respectively, wherein the second bit lines extend in the first direction to be connected to the second contact plugs, respectively.

4. The semiconductor device according to claim 3, wherein the first bit line is arranged between the second bit lines neighboring in the second direction.

5. The semiconductor device according to claim 3, wherein each of the first contact plugs and the second contact plugs extends longer in a third direction than the third contact plug and directly contacts the second to $(N-1)^{th}$ channel pillars of the first pillar group and the second pillar group, and wherein the third direction is perpendicular to each of the first and second directions.

6. The semiconductor device according to claim 3, wherein the first to $N^{th}$ channel pillars of the first pillar group are arranged in zig-zag form in the first direction, wherein the first contact plugs of the first plug group are arranged in zig-zag form in the first direction along an arrangement of the second to $(N-1)^{th}$ channel pillars of the first pillar group, and are formed to have narrower diameters than the second to $(N-1)^{th}$ channel pillars of the first pillar group, wherein the first to $N^{th}$ channel pillars of the second pillar group are arranged in zig-zag form in the first direction, and wherein the second contact plugs of the second plug group are arranged in zig-zag form in the first direction along an arrangement of the second to $(N-1)^{th}$ channel pillars of the second pillar group, and are formed to have narrower diameters than the second to $(N-1)^{th}$ channel pillars of the second pillar group.

7. A semiconductor device comprising:

a first upper stacked body and a second upper stacked body neighboring each other in a first direction, and separated from each other by a slit, wherein the slit extends along a second direction;

a first pillar group including first to $N^{th}$ channel pillars, wherein the first to $N^{th}$ channel pillars of the first pillar group penetrate the first upper stacked body;

a second pillar group including first to $N^{th}$ channel pillars, wherein the first to $N^{th}$ channel pillars of the second pillar group penetrate the second upper stacked body; and a contact line extending from the $N^{th}$ channel pillar of the first pillar group adjacent to the slit towards the $N^{th}$ channel pillar of the second pillar group adjacent to the slit, wherein the contact line extends towards inside of the first upper stacked body and the second upper stacked body, and contacts a side wall of the $N^{th}$ channel pillar of the first pillar group and a side wall of the $N^{th}$ channel pillar of the second pillar group, wherein N is a positive integer, and wherein each of the $N^{th}$ channel pillars of the first and second pillar groups comprises:

a core insulating layer;

a capping conductive layer arranged over a top of the core insulating layer and having a side wall contacting the contact line; and a channel layer surrounding the core insulating layer and the capping conductive layer.

* * * * *